(12) United States Patent
Matsuzawa et al.

(10) Patent No.: US 8,947,287 B2
(45) Date of Patent: Feb. 3, 2015

(54) PIPELINE A/D CONVERTER AND A/D CONVERTING METHOD

(75) Inventors: Akira Matsuzawa, Tokyo (JP); Masaya Miyahara, Tokyo (JP)

(73) Assignee: Tokyo Institute of Technology (JP)

( * ) Notice: Subject to any disclaimer, the term of this patent is extended or adjusted under 35 U.S.C. 154(b) by 327 days.

(21) Appl. No.: 13/593,868

(22) Filed: Aug. 24, 2012

(65) Prior Publication Data

US 2013/0044017 A1 Feb. 21, 2013

Related U.S. Application Data

(63) Continuation of application No. PCT/JP2010/001313, filed on Feb. 26, 2010, and a continuation of application No. PCT/JP2010/005929, filed on Oct. 4, 2010.

(51) Int. Cl.
*H03M 1/34* (2006.01)
*H03M 1/16* (2006.01)

(52) U.S. Cl.
CPC .................................... *H03M 1/165* (2013.01)
USPC ............................ 341/162; 341/155; 341/161

(58) Field of Classification Search
CPC ................................ H03M 1/165; H03M 1/36
USPC ......................................... 341/155, 161, 162
See application file for complete search history.

(56) References Cited

U.S. PATENT DOCUMENTS

| | | | | |
|---|---|---|---|---|
| 7,280,064 | B2 * | 10/2007 | Lin | 341/155 |
| 7,330,145 | B2 * | 2/2008 | Van Der Ploeg | 341/161 |
| 7,397,407 | B2 * | 7/2008 | Shimizu et al. | 341/148 |
| 7,760,125 | B2 * | 7/2010 | Shimizu et al. | 341/159 |
| 2007/0052573 | A1 * | 3/2007 | Lin | 341/161 |

FOREIGN PATENT DOCUMENTS

| | | |
|---|---|---|
| JP | 2006-54608 A | 2/2006 |
| WO | 2009122656 A1 | 10/2009 |

OTHER PUBLICATIONS

International Preliminary Report on Patentability for International Application No. PCT/JP2010/001313, dated Sep. 18, 2012, with English translation.
International Preliminary Report on Patentability for International Application No. PCT/JP2010/005929, dated Sep. 18, 2012, with English translation.

(Continued)

*Primary Examiner* — Jean B Jeanglaude
(74) *Attorney, Agent, or Firm* — Cantor Colburn LLP

(57) ABSTRACT

An A-type converter circuit compares an input voltage with multiple threshold voltages, judges which segment it belongs to, and generates first and second voltages with the input voltage segment between them. The A-type converter circuit generates third and fourth voltages by amplifying the differences between the first and the input voltages and between the second and the input voltages. A B-type converter circuit divides the range between the third and fourth voltages into multiple segments, and judges which segment includes the common voltage. Subsequently, the B-type converter circuit generates fifth and sixth voltages with the common voltage segment between them. The B-type converter circuit generates a seventh (the next stage's third voltage) and an eighth voltage by amplifying the differences between the fifth and the common voltages and between the sixth and the common voltages.

24 Claims, 20 Drawing Sheets

(56) References Cited

OTHER PUBLICATIONS

International Search Report for International Patent Application No. PCT/JP2010/001313, mailed Apr. 20, 2010, with English translation.
International Search Report for International Patent Application No. PCT/JP2010/005929, mailed Oct. 26, 2010, with English translation.
Asada, Yusuke, et al. "A 6-bit, 7-mA, 250-fJ, 700-MS/s Subranging ADC", IEEE Asian Solid-state Circuits Conference (A-SSCC), Taiwan, Nov. 2009, 5-3, pp. 141-144.
Sushihara, Koji, et al., "A 7b 450MSPS 50mW CMOS ADC in 0.3mm2", IEEE International Solid-State Circuits Conference, Digest of Technical, 2002, pp. 170-171.

* cited by examiner

UCB

1030

PIPELINE A/D CONVERTER AND A/D CONVERTING METHOD

BACKGROUND OF THE INVENTION

1. Field of the Invention

The present invention relates to a pipeline AD/converter.

2. Description of the Related Art

In order to convert an analog voltage into a digital signal, a pipeline A/D converter is employed. FIGS. 1A through 1C are block diagrams showing a configuration of a typical pipeline A/D converter and a graph showing its input/output characteristics. An A/D converter 1100 includes multiple (n stages of) unit converter circuits $UC_1$ through $UC_n$ connected to one another in a cascade manner.

The unit converter circuits $UC_1$ through $UC_n$ sequentially execute A/D conversion in units of m bits from the most significant bit MSB to the least significant bit LSB. FIG. 1B shows a configuration of a unit converter circuit UC. Each unit converter circuit UC includes an operational amplifier OA1, a switch circuit SW, and a sub-A/D converter SADC, and is configured to alternately and repeatedly switch its state between a sampling state $\phi 0$ and a differential amplification state $\phi 1$ in a time sharing manner in synchronization with a clock signal. When a given stage of such a unit converter circuit UC is in the sampling state $\phi 0$, the adjoining stage of such a unit converter circuit is in the differential amplification state $\phi 1$.

An input voltage $V_{in}$ is input to an input terminal Pi of each stage, from the immediately upstream stage. The input voltage is configured in a range between $-V_{ref}$ and $+V_{ref}$. In the sampling state $\phi 0$, the sub-A/D converter SADC is configured to compare the input voltage $V_{in}$ with multiple reference voltages, and to generate comparison data D1 which represents the comparison result k. With such an example, the comparison data D1 has a 6-valued, i.e., approximately 2.5-bit, redundant data structure. Thus, the input voltage $V_{in}$ is sampled (quantized) as follows.

When $-V_{ref} \le V_{in} < -\frac{5}{8} \times V_{ref}$ $k=-3$.

When $-\frac{5}{8} \times V_{ref} \le V_{in} < -\frac{3}{8} \times V_{ref}$ $k=-2$.

When $-\frac{3}{8} \times V_{ref} \le V_{in} < -\frac{1}{8} \times V_{ref}$ $k=-1$.

When $-\frac{1}{8} \times V_{ref} \le V_{in} < +\frac{1}{8} \times V_{ref}$ $k=0$.

When $+\frac{1}{8} \times V_{ref} \le V_{in} < +\frac{3}{8} \times V_{ref}$ $k=1$.

When $+\frac{3}{8} \times V_{ref} \le V_{in} < +\frac{5}{8} \times V_{ref}$ $k=2$.

When $+\frac{5}{8} \times V_{ref} \le V_{in} < +V_{ref}$ $k=3$.

Furthermore, in the sampling state $\phi 0$, a switch $S_1$ is turned on, and a switch $S_2$ is switched to the input terminal Pi side. Moreover, the switch circuit SW selects the input voltage $V_{in}$, and applies the input voltage $V_{in}$ thus selected to one terminal of each of input capacitors $C_{S1}$ through $C_{S3}$. As a result, a feedback capacitor $C_f$ and the input capacitors $C_{S1}$ through $C_{S3}$ are each charged by the same input voltage $V_{in}$.

The next time the phase of the clock signal is switched, the state is switched to the differential amplification state $\phi 1$ in which the switch $S_1$ is turned off, and the switch $S_2$ is switched to the output terminal Po side of the operational amplifier OA. Furthermore, the sub-A/D converter SADC outputs the comparison result to the switch circuit SW. The switch circuit SW is configured to select one from among a set of reference voltages $+V_{ref}$, $-V_{ref}$, and GND, according to the comparison result, and to apply the reference voltage thus selected to one terminal of each of the input capacitors $C_{S1}$ through $C_{S3}$. As described above, the converted value k that represents the comparison result is switchable to any one of seven values in a range between −3 and +3. When k is positive, the switch circuit SW applies the reference voltage $+V_{ref}$ to each of k input capacitors $C_S$, and applies the ground voltage GND to each of the other input capacitors $C_S$. Conversely, when k is negative, the switch circuit SW applies the reference voltage $-V_{ref}$ to each of (−k) input capacitors $C_S$, and applies the ground voltage GND to the other input capacitors. When k=0, the switch circuit SW applies the ground voltage GND to all the input capacitors $C_{31}$ through $C_{S3}$.

Assuming that all the capacitors $C_f$ and $C_{S1}$ through $C_{S3}$ each have the same capacitance $C_0$, the charge Q held by the inverting input terminal (−) of the operational amplifier OA is represented by the following Expression.

$$Q = -4C_0 \cdot V_{in} \quad (1)$$

With the electric potential of the inverting input terminal (−) of the operational amplifier OA as vi, with the output voltage thereof as vo, and with the gain thereof as G, the following Expression holds true.

$$(vi - V_{ref}) \times k \times C_0 + (vi - vo)C_0 = Q = -4C_0 \cdot V_{in} \quad (2a)$$

$$Vo = -G \cdot vi \quad (2b)$$

Thus, in the differential amplification state $\phi 1$, the output voltage $V_{out}$ (=vo) of each unit converter circuit UC is represented by the following Expression (3).

$$V_{out} = 4(V_{in} - k/4 \times V_{ref})/\{1 + (k+1)/G\} \quad (3)$$

Now, assuming that G is infinite, the following Expression (3') that represents the input/output characteristics of each unit converter circuit UC is derived.

$$V_{out} = 4 \cdot (V_{in} - k \times V_{ref}/4) \quad (3')$$

FIG. 1C shows the input/output characteristics of the unit converter circuit UC, which is represented by Expression (3). Each open circle represents the corresponding reference voltage used by the sub-A/D converter SADC. In the drawing, each solid circle represents the corresponding offset voltage in the x-axis direction, which is represented by the second term of the right side of Expression (3'), i.e., $(k \times V_{ref})$. That is to say, the unit converter circuit UC is configured to amplify the difference between the input voltage $V_{in}$ and the offset voltage with a gain of 4.

The output voltage $V_{out}$ is supplied as the input voltage $V_{in}$ to the next-stage unit converter circuit UC. As shown in FIG. 1A, the multiple unit converter circuits UC perform a pipeline operation in synchronization with the clock signal, thereby outputting, via the respective unit converter circuits UC, the data D1, D2, and so forth, each representing the corresponding converted value k. It should be noted that the final-stage unit converter circuit UC is not required to perform the differential amplification. Thus, the final stage unit converter circuit UC may be configured as a comparator array (sub-A/D converter) alone.

RELATED ART DOCUMENTS

Patent Documents

[Patent Document 1]
Japanese Patent Application Laid Open No. 2006-54608

Non-Patent Document

[Non-Patent Document 1]
K. Sushihara and A. Matsuzawa, "A 7b 450MSPS 50 mW CMOS ADC in 0.3 mm2", IEEE International Solid-State Circuits Conference, Digest of Technical, 2002, pp. 170-171.
[Non-Patent Document 2]
Yusuke Asada, Kei Yoshihara, Tatsuya Urano, Masaya Miyahara, and Akira Matsuzawa, "A 6-bit, 7-mA, 250-fJ, 700-MS/s Subranging ADC," IEEE Asian Solid-state Circuits Conference (A-SSCC), Taiwan, November 2009, 5-3, pp. 141-144.

The conversion accuracy of such a conventional pipeline A/D converter 1100 as shown in FIG. 1 depends on the gain accuracy of the circuit system. Specifically, the conversion accuracy depends on the accuracy of the capacitance ratio between the capacitors $C_f$ and $Cs_1$ through $Cs_3$, and the gain of the operational amplifier OA1. Description has been made above assuming that the gain G of the operational amplifier OA1 is infinite. However, in actuality, such an operational amplifier has a limited gain. In addition, in recent years, as the fine semiconductor process has been advanced, there is a tendency for the gain of such an operational amplifier to become smaller. With the resolution as N bit, and with the conversion error as ¼LSB, the required gain G is on the order of the value represented by the following Expression (4).

$$G\ (dB) > 6N+10 \tag{4}$$

Thus, when the resolution is 10 bit, the required gain G is 70 dB or more. Furthermore, when resolution is 12 bit, the required gain G is 82 dB or more. In recent years, such an operational amplifier employing a fine CMOS device has a gain of on the order of 60 dB at most. That is to say, it is difficult for such a fine CMOS process to provide such a high gain.

Furthermore, such a conversion system requires negative feedback amplification using an operational amplifier. With such a negative feedback circuit including an operational amplifier having a high gain, such a circuit system is configured such that its accuracy is determined according to the accuracy of its capacitance ratio. However, in many cases, such a negative feedback circuit leads to undesired oscillation or otherwise an increase in the settling time, which is a great challenge for providing a high-speed A/D converter.

SUMMARY OF THE INVENTION

The present invention has been made in order to solve such a problem. Accordingly, it is an exemplary purpose of an embodiment of the present invention to provide a pipeline A/D converter without utilizing a negative feedback circuit.

An embodiment of the present invention relates to an A/D converting method for converting an analog input voltage into digital data. The operation employing this method comprises:
1) a first step in which the input voltage is compared with multiple threshold voltages, and judgment is made regarding which one from among multiple segments the input voltage belongs to;

2) a second step in which a first voltage and a second voltage are generated such that the segment to which the input voltage belongs is sandwiched between the first voltage and the second voltage;
3) a third step in which a third voltage is generated by amplifying the difference between the first voltage and the input voltage with a predetermined common voltage as a base;
4) a fourth step in which a fourth voltage is generated by amplifying the difference between the second voltage and the input voltage with the common voltage as a base;
5) a fifth step in which a region between the third voltage and the fourth voltage is divided into multiple segments, and judgment is made regarding which one from among the multiple segments the common voltage belongs to;
6) a sixth step in which a fifth voltage and a sixth voltage are generated such that the segment to which the common voltage belongs is sandwiched between the fifth voltage and the sixth voltage;
7) a seventh step in which a seventh voltage is generated by amplifying the difference between the fifth voltage and the common voltage with the common voltage as a base; and
8) an eighth step in which an eighth voltage is generated by amplifying the difference between the sixth voltage and the common voltage with the common voltage as a base. With such an operation, the fifth step through the eighth step are repeatedly executed. When the flow returns from the eighth step to the fifth step, the seventh voltage obtained in the seventh step in the previous loop is used as the third voltage in the fifth step in the subsequent loop, and the eighth voltage obtained in the eighth step in the previous loop is used as the fourth voltage in the fifth step in the subsequent loop.

Such an embodiment provides high-speed A/D conversion.
Also, in the sixth step, the fifth voltage and the sixth voltage may each be generated by interpolation of a range between the third voltage and the fourth voltage.

Also, the first voltage through the eighth voltage may each be generated as a differential signal.

Also, in the sixth step, the fifth voltage and the sixth voltage may each be generated by performing extrapolation from the third voltage and the fourth voltage.

Another embodiment of the present invention relates to a pipeline A/D converter. The A/D converter comprises an A-type converter circuit, at least one B-type converter circuit, and a comparator array, connected in series.

The A-type converter circuit comprises: a first sub-A/D converter configured to compare the input voltage with multiple threshold voltages, and to judge which one from among multiple segments the input voltage belongs to; a first amplifier circuit configured to generate a first voltage having a voltage level that is equal to or greater than the upper limit of the segment to which the input voltage belongs, to generate a third voltage by amplifying the difference between the first voltage and the input voltage with a predetermined common voltage as a base, and to output the third voltage to the B-type converter circuit arranged as a downstream stage; and a second amplifier circuit configured to generate a second voltage having a voltage level that is equal to or smaller than the lower limit of the segment to which the input voltage belongs, to generate a fourth voltage by amplifying the difference between the second voltage and the input voltage with the common voltage as a base, and to output the fourth voltage to the B-type converter circuit arranged as a downstream stage.

The B-type converter circuit comprises: a second-sub A/D converter configured to divide a range between the third voltage and the fourth voltage received from the upstream stage into multiple segments, and to judge which one from among the multiple segments the common voltage belongs to; a third amplifier circuit configured to generate a seventh voltage by amplifying the difference between the common voltage and a fifth voltage having a voltage level that is equal to or greater than the upper limit of the segment to which the common voltage belongs, and to output the seventh voltage as the third voltage to the B-type converter circuit arranged as the downstream stage; and a fourth amplifier circuit configured to generate an eighth voltage by amplifying the difference between the common voltage and a sixth voltage having a voltage level that is equal to or smaller than the lower limit of the segment to which the common voltage belongs, and to output the eighth voltage as the fourth voltage to the B-type converter circuit arranged as the downstream stage. The comparator array is configured to divide a range between the third voltage and the fourth voltage received from the B-type converter circuit arranged as the immediately upstream stage into multiple segments, and to judge which one from among multiple segments the common voltage belongs to.

Such an embodiment provides high-speed A/D conversion.

Also, the first amplifier circuit may comprise: a first capacitor array comprising multiple first capacitors arranged such that their first terminals are connected together; a first switch circuit configured to apply the input voltage to second terminals of the first capacitor array in a sampling state, and to apply, in an interpolation amplification state, a reference voltage to the second terminals of certain first capacitors from among the first capacitor array, the number of which is determined according to the judgment result obtained by the first sub-A/D converter; a first switch arranged between the first terminal of the first capacitor array and a fixed voltage terminal, and configured to be turned on in the sampling state, and to be turned off in the interpolation amplification state; and a first amplifier arranged such that the common voltage is input to its first input terminal, and its second input terminal is connected to the first terminal of the first capacitor array. Also, the second amplifier circuit may be configured in the same manner as that of the first amplifier circuit.

Also, the third amplifier circuit and the fourth amplifier circuit may be respectively configured to generate the fifth voltage and the sixth voltage by interpolating from the third voltage and the fourth voltage.

Also, the third amplifier circuit may comprise: a third capacitor array comprising multiple third capacitors arranged such that their first terminals are connected together; a fourth capacitor array arranged such that their first terminals are connected together to the first terminals of the third capacitor array; a third switch circuit configured to apply the third voltage to the second terminals of the third capacitor array in a sampling state, and to apply, in an interpolation amplification state, a fixed voltage to the second terminals of certain third capacitors from among the third capacitor array, the number of which is determined according to the judgment result obtained by the second sub-A/D converter; a fourth switch circuit configured to apply the fourth voltage to the second terminals of the fourth capacitor array in the sampling state, and to apply, in the interpolation amplification state, a fixed voltage to the second terminals of the certain fourth capacitors from among the fourth capacitor array, the number of which is determined according to the judgment result obtained by the second sub-A/D converter; a third switch arranged between the fixed voltage terminal and the connected-together first terminals of the third capacitor array and the fourth capacitor array, and configured to be turned on in the sampling state, and to be turned off in the interpolation amplification state; and a third amplifier arranged such that the common voltage is input to its first input terminal, and its second input terminal is connected to the first terminals of the third capacitor array and the fourth capacitor array to which they are connected together. Also, the fourth amplifier circuit may be configured in the same manner as that of the aforementioned third amplifier circuit.

Also, the third switch circuit may be configured to apply the third voltage received from its upstream stage as the fixed voltage when the fixed voltage is to be applied to the third capacitor array in the interpolation amplification state, and the fourth switch circuit may be configured to apply the fourth voltage received from its upstream stage as the fixed voltage when the fixed voltage is to be applied to the fourth capacitor array in the interpolation amplification state, thereby canceling the offset voltage of the amplifier of the converter circuit of the upstream stage.

It should be noted that any combination of the aforementioned components or any manifestation thereof may be mutually substituted between a method, apparatus, and so forth, which are effective as an embodiment of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1A:
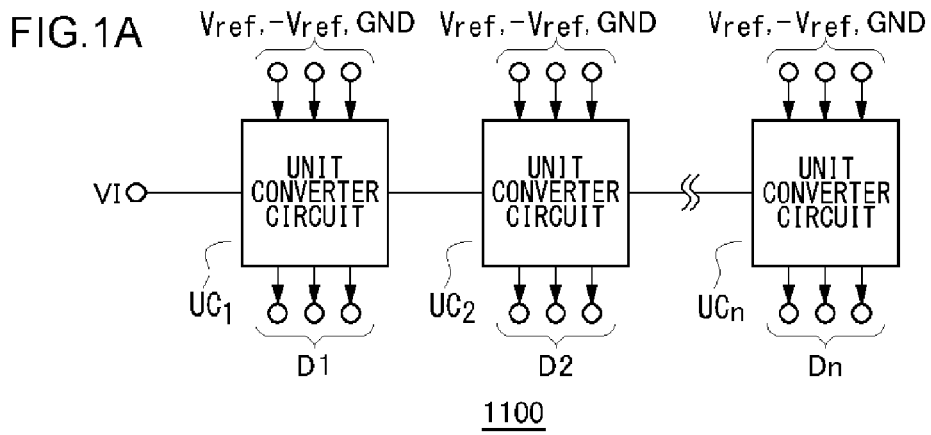
FIGS. 1A through 1C are block diagrams showing a configuration of a typical pipeline A/D converter and a graph showing its input/output characteristics.
Figure 1B:
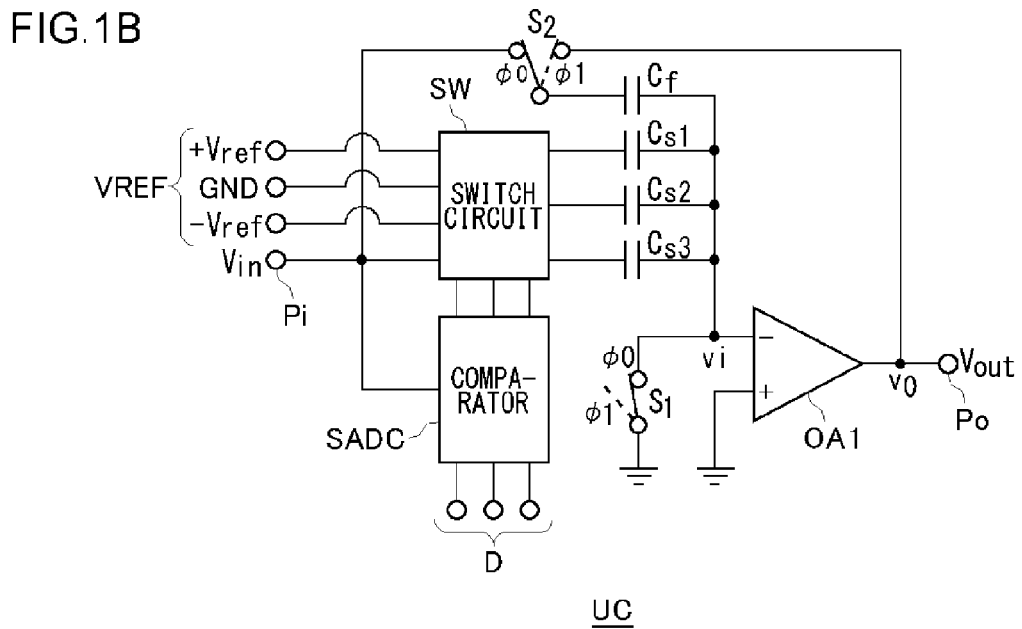
Figure 1C:
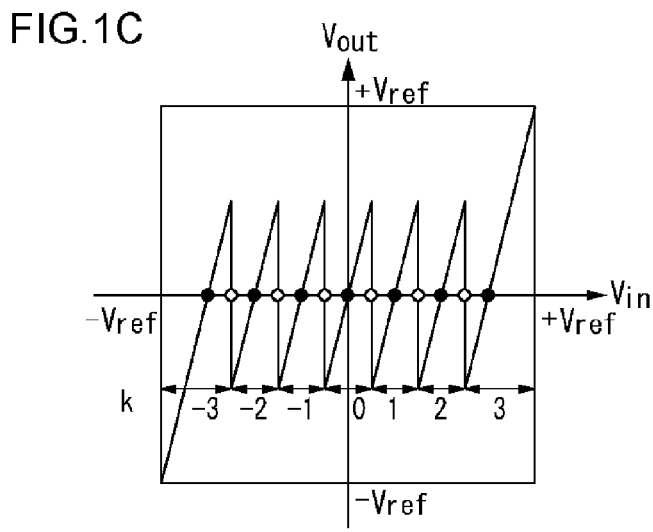

Description will be made below regarding preferred embodiments according to the present invention with reference to the drawings. The same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B.

Similarly, the state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

Figure 2:
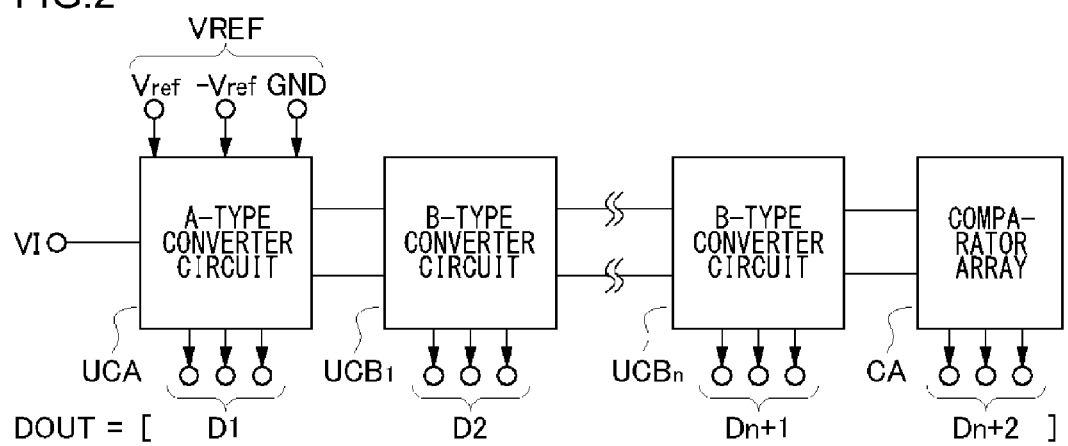
FIG. 2 is a block diagram which shows a configuration of a pipeline A/D converter according to an embodiment.

FIG. 2 is a block diagram which shows a configuration of a pipeline A/D converter 100 according to an embodiment. The A/D converter 100 is configured to convert an analog input voltage VI into a digital data DOUT. Description will be made assuming that the analog input voltage VI is configured in a range between $-V_{ref}$ and $+V_{ref}$.

The A/D converter 100 includes an A-type converter circuit UCA and at least one or more B-type converter circuits $UCB_1$ through $UCB_n$, and a comparator array CA, which are connected in series. The comparator array CA configured as the final stage is configured to perform the same processing as that of a second sub-A/D converter 20 of the B-type converter circuit described later. Thus, the comparator array CA configured as the final stage may be configured as a part of the (n+1)-th stage B-type converter circuit $UCB_{n+1}$. Also, the comparator array CA may be configured as a separate comparator array.

The converter circuits UCA and $UCB_1$ through $UCB_n$, and the comparator array CA sequentially execute A/D conversion in units of m bits from the uppermost significant bit MSB up to the least significant bit LSB.

Each of the unit converter circuits UCA and $UCB_1$ through $UCB_n$ is configured to alternately and repeatedly switch its state between a sampling state φ0 and a differential amplification state (interpolation amplification state) φ1 in a time sharing manner in synchronization with a clock signal. When a given stage of such a converter circuit is in the sampling state φ0, the adjoining stage of such a unit converter circuit is in the differential amplification state (interpolation amplification state) φ1.

[A-Type Converter Circuit]

First, description will be made regarding the A-type converter circuit UCA arranged as the first stage.

Figure 3:
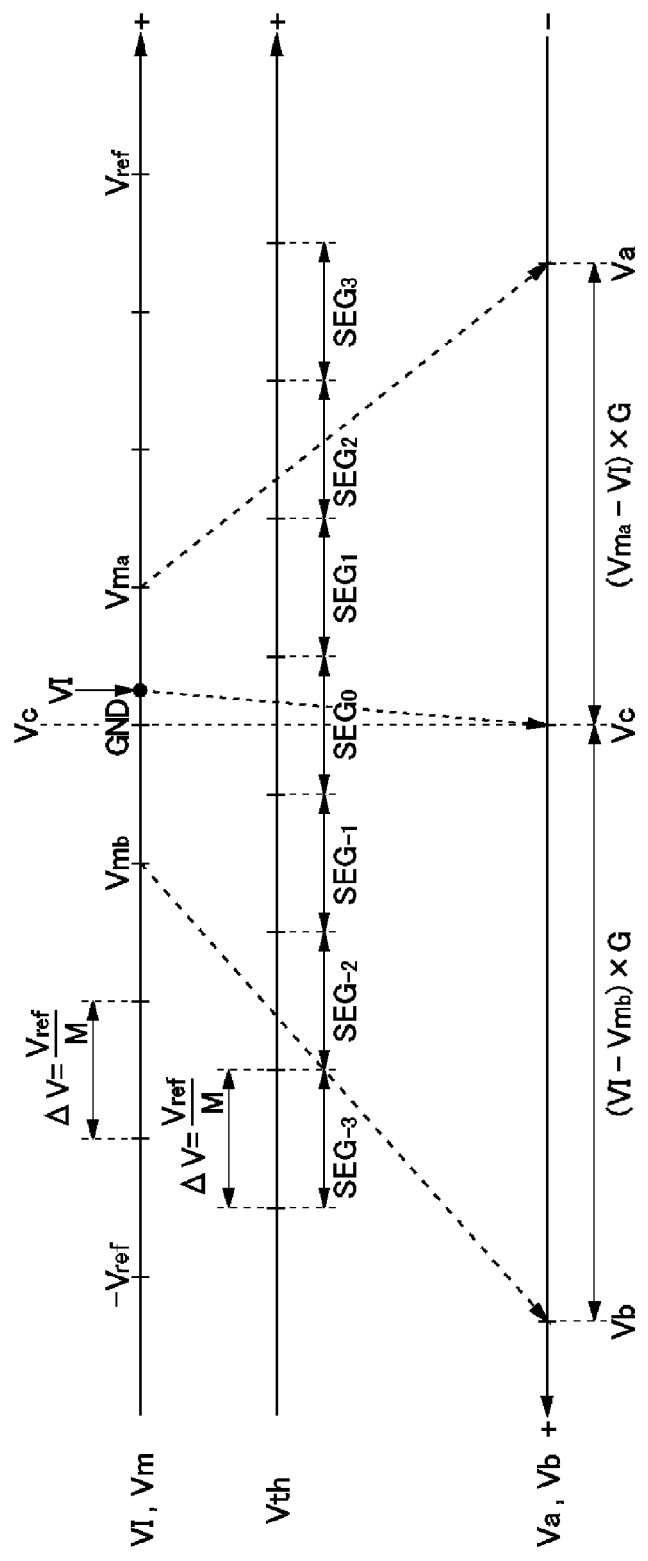
FIG. 3 is a diagram for describing the function of the A-type converter circuit.

FIG. 3 is a diagram for describing the function of the A-type converter circuit UCA. The A-type converter circuit UCA is configured to receive the input voltage VI and the reference voltage set VREF (e.g., a set of the three voltages $+V_{ref}$, $-V_{ref}$, and GND=0 V). The A-type converter circuit UCA is configured to alternately and repeatedly switch its state between the sampling state φ0 and the differential amplification state φ1.

In the sampling state φ0, the A-type converter circuit UCA is configured to divide the range between the reference voltages $-V_{ref}$ and $+V_{ref}$ into multiple segments SEG, and to judge which segment the input voltage VI belongs to (sampling).

Specifically, the A-type converter circuit UCA is configured to compare the input voltage VI with multiple threshold voltages Vth defined at intervals ΔV ($=V_{ref}/M$) between the reference voltages $-V_{ref}$ and $+V_{ref}$, and to output conversion data D1 which represents the comparison result. The conversion data D1 is configured to represent the identification number k of the segment to which the input voltage VI belongs. FIG. 3 shows a case in which the input voltage VI belongs to the segment $SEG_0$.

In the next stage after the phase of the clock signal is switched, the A-type converter circuit UCA enters the differential amplification state φ1. The A-type converter circuit UCA is configured to generate two intermediate voltages $Vm_a$ and $Vm_b$ according to the input voltage VI.

The first intermediate voltage $Vm_a$ is represented by the following Expression (5a) using a predetermined common voltage Vc and an integer parameter $k_a$.

$$Vm_a = Vc + k_a \times V_{ref}/M \tag{5a}$$

The first intermediate voltage $Vm_a$ is configured as a voltage that is higher than the upper threshold voltage of the segment $SEG_k$ to which the input voltage VI belongs.

The second intermediate voltage $Vm_b$ is represented by the following Expression (5b) using an integer parameter $k_b$.

$$Vm_b = Vc + k_b \times V_{ref}/M \tag{5b}$$

The second intermediate voltage $Vm_b$ is configured as a voltage that is lower than the lower threshold voltage of the segment $SEG_k$ to which the input voltage VI belongs. That is to say, the intermediate voltages $Vm_a$ and $Vm_b$ are determined such that the segment $SEG_k$ is positioned between the intermediate voltages $Vm_a$ and $Vm_b$.

It should be noted that the intermediate voltages $Vm_a$ and $Vm_b$ are preferably offset with respect to the respective threshold voltages that define the segment SEG. The offset amount is preferably set to $V_{ref}/(2M)$.

Next, the A-type converter circuit UCA amplifies the difference between the input voltage VI and the intermediate voltage $Vm_a$ by the gain G with the common voltage Vc as the base, so as to generate a first output voltage Va. In the same way, the A-type converter circuit UCA is configured to amplify the difference between the input voltage VI and the intermediate voltage $Vm_b$ by the gain G with the common voltage Vc as the base so as to generate a second output voltage Vb. The output voltage Va and the second output voltage Vb are output via the first output terminal $Po_a$ and the second output terminal $Po_b$, respectively.

$$Va = G \times (Vm_a - VI - Vc) + Vc \quad (6a)$$
$$= G \times (k_a \times V_{ref}/M - VI) + Vc$$

$$Vb = G \times (Vm_b - VI - Vc) + Vc \quad (6b)$$
$$= G \times (k_b \times V_{ref}/M - VI) + Vc$$

That is to say, it can be understood that the differential amplification processing represented by Expression (6a) or (6b) is processing in which the input voltage VI is shifted (offset) to the common voltage Vc, and the voltage difference between the intermediate voltage $Vm_a$ and the input voltage VI thus offset is amplified so as to generate the voltage Va, and the voltage difference between the intermediate voltage $Vm_b$ and the input voltage VI thus offset is amplified so as to generate the voltage Vb.

Figure 4:
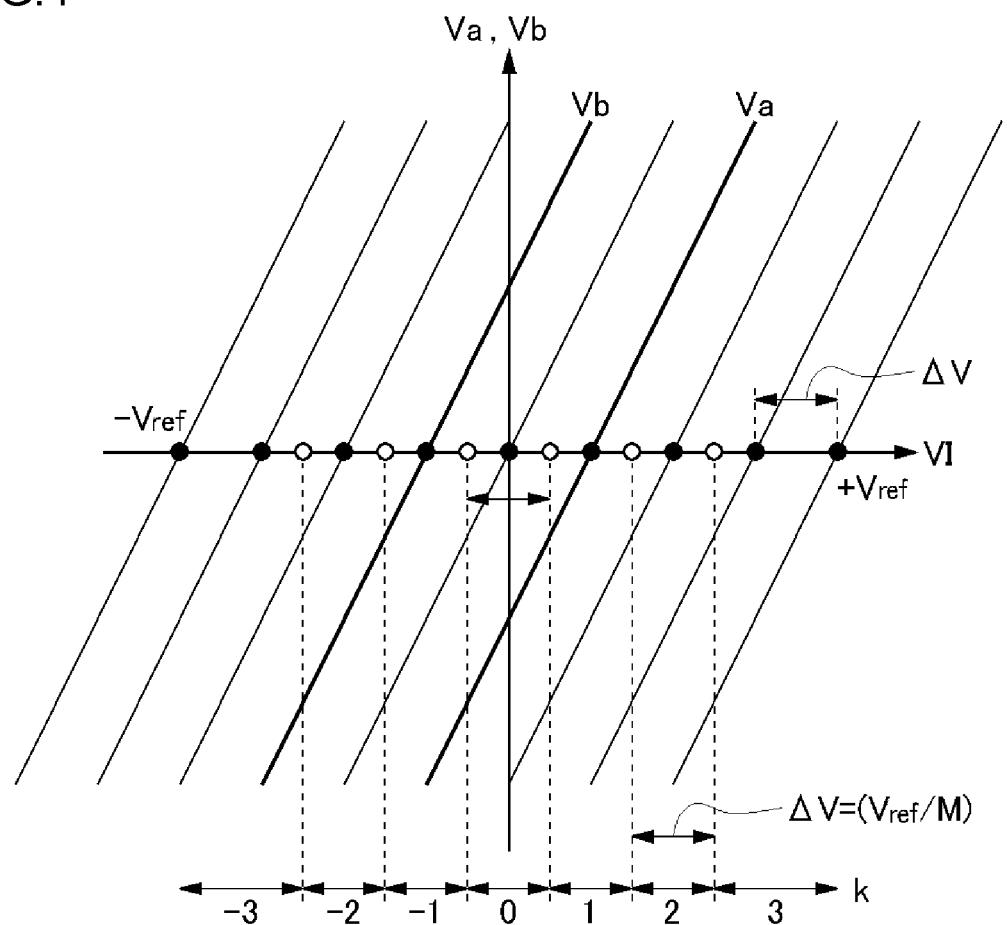
FIG. 4 is a graph which shows the input/output characteristics of the A-type converter circuit.

FIG. 4 is a graph which shows the input/output characteristics of the A-type converter circuit UCA. For simplicity of description and ease of understanding, description will be made below assuming that the common voltage Vc is set to the ground voltage GND (=0 V).

The first output voltage Va and the second output voltage Vb are represented by the following Expressions.

$$Va = G \times (VI - k_a/M \cdot V_{ref}) \quad (7a)$$

$$Vb = G \times (VI - k_b/M \cdot V_{ref}) \quad (7b)$$

Here, $k_a$ and $k_b$ represent integer parameters determined such that the voltage range of the input voltage VI is sandwiched between the two lines Va and Vb. Expression (7a) represents a line having a slope G and x-intercept ($k_a/M \cdot V_{ref}$), and Expression (7b) represents a line having a slope G and x-intercept ($k_b/M \cdot V_{ref}$). The x-intercept ($k_a/M \cdot V_{ref}$) will be referred to as the "first offset voltage", and the x-intercept ($k_b/M \cdot V_{ref}$) will be referred to as the "second offset voltage", hereafter.

The values $k_a$ and $k_b$ may be determined as follows using an integer parameter $\alpha$ ($\alpha \geq 1$).

$$K_a = (k+\alpha)$$

$$K_b = (k-\alpha)$$

As can be clearly understood with reference to FIG. 4 and Expressions (7a) and (7b), the difference between the two output voltages Va and Vb, i.e., (Vb−Va) is represented by the following Expression (8).

$$Vb - Va = G \times (k_a - k_b)/M \cdot V_{ref} = G \times 2\alpha/M \cdot V_{ref} \quad (8)$$

That is to say, the voltage difference (Vb−Va) is maintained at an approximately constant value regardless of the input voltage VI. For example, the values of a, M, and G, may be preferably determined such that the following Expression (8a) is satisfied, i.e., such that the relation $G \times 2\alpha/M = 1$ is satisfied.

$$Vb - Va = V_{ref} \quad (8a)$$

FIG. 4 shows a case in which M=4 and G=2, and each threshold voltage Vth is represented by an open circle. For example, when judgment is made in the sampling state φ0 that the input voltage VI corresponds to k=0, i.e., that $-V_{ref}/8 < VI < V_{ref}/8$ is satisfied, the output voltages Va and Vb represented by the following Expressions (9a) and (9b) are output.

$$Va = G \times (VI - 1/M \cdot V_{ref}) \quad (9a)$$

$$Vb = G \times (VI - 1/M \cdot V_{ref}) \quad (9b)$$

Here, description is being made regarding an arrangement in which the integer parameter a is set to 1.

Next, description will be made regarding a specific example configuration of the A-type converter circuit UCA.

Figure 5:
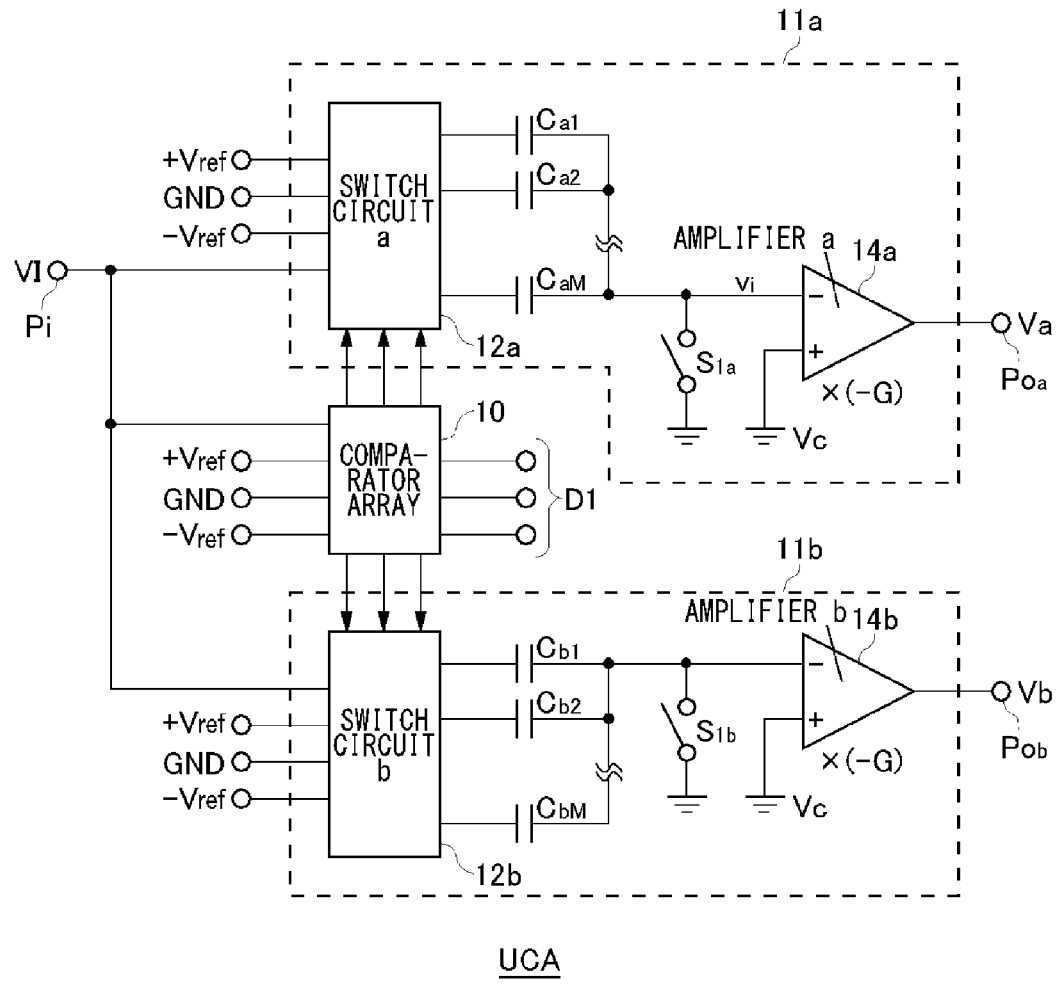
FIG. 5 is a circuit diagram which shows a configuration of the A-type converter circuit.

FIG. 5 is a circuit diagram which shows a configuration of the A-type converter circuit UCA. The A-type converter circuit UCA includes a first sub-A/D converter 10, a first amplifier circuit 11a, and a second amplifier circuit 11b.

In the sampling state φ0, the first sub-A/D converter 10 is configured to compare the input voltage VI with a set of threshold voltages Vth, to judge which one from among the multiple segments the input voltage VI belongs to, and to generate the conversion data D1 which represents the comparison result. For example, the threshold voltage set Vth may be determined such that the following Expression (10) is satisfied.

$$Vth_j = V_{ref}/(2M) + j \times V_{ref}/M \quad (10)$$

Here, j represents an integer ranging between −M and M.

The input voltage VI is sampled as follows by means of the first sub-A/D converter 10.

When $-V_{ref} < VI < -5/8 \times V_{ref}$, k=−3.

When $-5/8 \times V_{ref} < VI < -3/8 \times V_{ref}$, k=−2.

When $-3/8 \times V_{ref} < VI < -1/8 \times V_{ref}$, k=−1.

When $-1/8 \times V_{ref} < VI < +1/8 \times V_{ref}$, k=0.

When $+1/8 \times V_{ref} < VI < +3/8 \times V_{ref}$, k=1.

When $+3/8 \times V_{ref} < VI < +5/8 \times V_{ref}$, k=2.

When $+5/8 \times V_{ref} < VI < +V_{ref}$, k=3.

The configuration of the first sub-A/D converter 10 is not restricted in particular. Rather, various kinds of currently-available or prospectively-available techniques may preferably be employed. For example, a comparators described in the non-patent document 1 or 2, which has been proposed by the present inventor, may preferably be employed as the first sub-A/D converter 10 according to the present invention. Alternatively, an arrangement may be made in which a threshold voltage Vth is generated by dividing the reference voltages $-V_{ref}$, GND, and $V_{ref}$ by means of resistors, and voltage comparison is performed using a comparator array.

The first amplifier circuit 11a is configured to generate a first voltage $Vm_a$ having a voltage level that is equal to or greater than the upper limit of the segment to which the input voltage VI belongs, and to amplify the difference between the first voltage $Vm_a$ and the input voltage VI with a predetermined common voltage Vc as the base, so as to generate a third voltage Va.

The second amplifier circuit 11b is configured to generate a second voltage $Vm_b$ having a voltage level that is equal to or smaller than the lower limit of the segment to which the input voltage VI belongs, and to amplify the difference between the second voltage $Vm_b$ and the input voltage VI with a predetermined common voltage Vc as the base, so as to generate a fourth voltage Vb. The first voltage $Vm_a$ and the second voltage $Vm_b$ are respectively generated such that the segment to which the input voltage VI belongs is sandwiched between them.

The first amplifier circuit 11a includes a first switch circuit 12a, a first amplifier 14a, a first capacitor array $C_{a1}$ through $C_{aM}$, and a first switch $S_{1a}$. Similarly, the second amplifier circuit 11b includes a second switch circuit 12b, a second amplifier 14b, a second capacitor array $C_{b1}$ through $C_{bM}$, and a second switch $S_{1b}$.

First, description will be made regarding the first amplifier circuit 11a. The first amplifier 14a is configured as an inverting amplifier having a gain (−G). The first amplifier 14a is arranged such that the common voltage Vc (ground voltage GND) is applied to the non-inverting input terminal thereof. When the voltage applied to the inverting input terminal of the first amplifier 14a is Vi, the output voltage Va thereof is represented by the following Expression (11).

$$Va = -G \times Vi \quad (11)$$

The first switch $S_{1a}$ is arranged between the inverting input terminal of the first amplifier 14a and a fixed voltage terminal (ground terminal). In the sampling state φ0, the first switch $S_{1a}$ is turned on, and in the differential amplification state φ1, the first switch $S_{1a}$ is turned off.

One terminal (first terminal) of each of the capacitors of the first capacitor array $C_{a1}$ through $C_{aM}$ is connected together to the inverting input terminal of the first amplifier 14a. Description will be made assuming that the capacitances of the capacitors $C_{a1}$ through $C_{aM}$ are each set to the same capacitance $C_0$.

The first switch circuit 12a is configured to receive the comparison result obtained by the first sub-A/D converter 10, i.e., the conversion data D1 which represents the value k or a control signal that corresponds to the conversion data D1. The first switch circuit 12a is configured as a switch matrix, within which multiple switches are included. The first switch circuit 12a is configured to selectively apply, according to the value k represented by the conversion data D1, one from among the input voltage VI, and the reference voltages $V_{ref}$, GND and $-V_{ref}$, to the other terminal (second terminal) of each of the capacitors $C_{a1}$ through $C_{aM}$ of the first capacitor array.

Specifically, in the sampling state φ0, the first switch circuit 12a applies the input voltage VI to the second terminals of all the capacitors $C_{a1}$ through $C_{aM}$. In this state, the first switch $S_{1a}$ is turned on. Thus, the capacitors $C_{a1}$ through $C_{aM}$ are each charged by the input voltage VI. The total amount of charge Q stored in these capacitors $C_{a1}$ through $C_{aM}$ is represented by the following Expression (12).

$$Q = -M \cdot C_0 \cdot VI \quad (12)$$

In the differential amplification state φ1, the first switch circuit 12a is configured to apply the reference voltage $V_{ref}$ to the second terminals of j capacitors selected from among the capacitors $C_{a1}$ through $C_{aM}$, and to apply the ground voltage GND to the second terminals of the other capacitors. The number j is determined by the value k. In this case, with the electric potential at the inverting input terminal of the first amplifier 14a as vi, the following Expression (13) holds true using the law of conservation of charge.

$$j \cdot C_0 \cdot (vi - V_{ref}) + (M-j) \cdot C_0 \cdot vi = Q = -M \cdot C_0 \cdot VI \quad (13)$$

Expression (13) is solved for vi, thereby obtaining the following Expression (14).

$$vi = -(VI - j \cdot V_{ref}/M) \quad (14)$$

From Expressions (11) and (14), the first output voltage Va is represented by the following Expression (15).

$$Va = -G \times vi = G \times (VI - j \cdot V_{ref}/M) \quad (15)$$

When the first switch circuit 12a applies the reference voltage $-V_{ref}$ to the second terminals of j capacitors, and applies the ground voltage GND to the second terminals of the other capacitors, the first output voltage Va is represented by the following Expression (16).

$$Va = -G \times vi = G \times (VI + j \cdot V_{ref}/M) \quad (16)$$

That is to say, with the A-type converter circuit UCA shown in FIG. 5, such an arrangement is capable of generating the first output voltage Va so as to satisfy the aforementioned Expression (7a). In a case in which $k_a = k+1$ in Expression (7a), the state of the first switch circuit 12a is determined as follows.

(1) When k≥0, the first switch circuit 12a applies $-V_{ref}$ to (k+1) capacitors, and applies the ground voltage GND to the other (M−(k+1)) capacitors.

(2) When k=−1, the first switch circuit 12a applies the ground voltage GND to all M capacitors.

(3) When k≤−2, the first switch circuit 12a applies the reference voltage $V_{ref}$ to (−k+1) capacitors, and applies the ground voltage GND to the other (M−(k+1)) capacitors.

With generalization such that $k_a = k+a$, the state of the first switch circuit 12a is determined as follows.

(1) When $k_a \geq 1$, the first switch circuit 12a applies $-V_{ref}$ to $k_a$ capacitors, and applies the ground voltage GND to the other (M−$k_a$) capacitors.

(2) When $k_a = 0$, the first switch circuit 12a applies the ground voltage GND to all M capacitors.

(3) When $k_a \leq -1$, the first switch circuit 12a applies the reference voltage $V_{ref}$ to ka capacitors, and applies the ground voltage GND to the other (M−$k_a$) capacitors.

A circuit group including the second switch circuit 12b, the second amplifier 14b, the capacitors $C_{b1}$ through $C_{bM}$, and the second switch $S_{1b}$, is configured to generate the second output voltage Vb in the same way as the aforementioned circuit group configured to generate the first output voltage Va, thereby generating the second output voltage Vb so as to satisfy Expression (7b).

In a case in which $k_b = k-1$ in the Expression (7b), the state of the second switch circuit 12b is determined as follows.

(1) When k≥2, the second switch circuit 12b applies $-V_{ref}$ to (k−1) capacitors, and applies the ground voltage GND to the other (M−(k−1)) capacitors.

(2) When k=1, the second switch circuit 12b applies the ground voltage GND to all M capacitors.

(3) When k≤0, the second switch circuit 12b applies the reference voltage $V_{ref}$ to (−k+1) capacitors, and applies the ground voltage GND to the other (M−(−k+1)) capacitors.

With generalization such that $k_b = k-a$, the state of the second switch circuit 12b is determined as follows.

(1) When $k_b \geq 1$, the second switch circuit 12b applies $-V_{ref}$ to $k_b$ capacitors, and applies the ground voltage GND to the other (M−$k_b$) capacitors.

(2) When $k_b = 0$, the second switch circuit 12b applies the ground voltage GND to all M capacitors.

(3) When $k_b \leq -1$, the second switch circuit 12b applies the reference voltage $V_{ref}$ to (−$k_b$) capacitors, and applies the ground voltage GND to the other (M+$k_b$) capacitors.

The above is the configuration of the A-type converter circuit UCA. In a case in which a voltage that differs from the ground voltage GND is used as the common voltage Vc, such a configuration can be made by replacing the ground terminal shown in the drawing with the common voltage terminal.

[B-Type Converter Circuit]

The B-type converter circuit UCB is configured to receive the first input voltage (third voltage) $Vi_a$ and the second input voltage (fourth voltage) $Vi_b$ from the immediately upstream A-type converter circuit UCA or B-type converter circuit UCB. For ease of understanding, description will be made below regarding an arrangement in which an A-type converter circuit UCA is arranged as the upstream stage.

Figure 6:
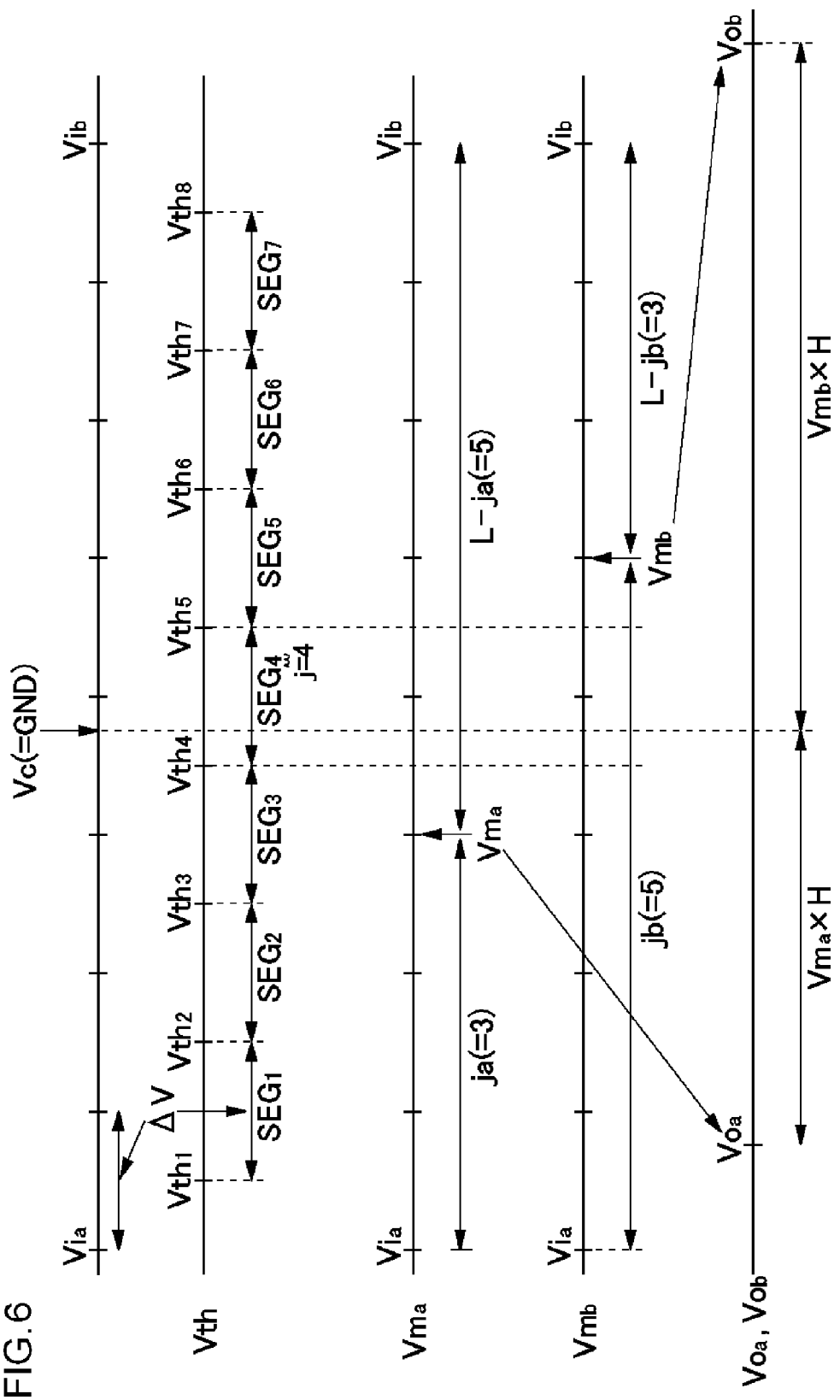
FIG. 6 is a diagram for describing the function of the B-type converter circuit.
Figure 7:
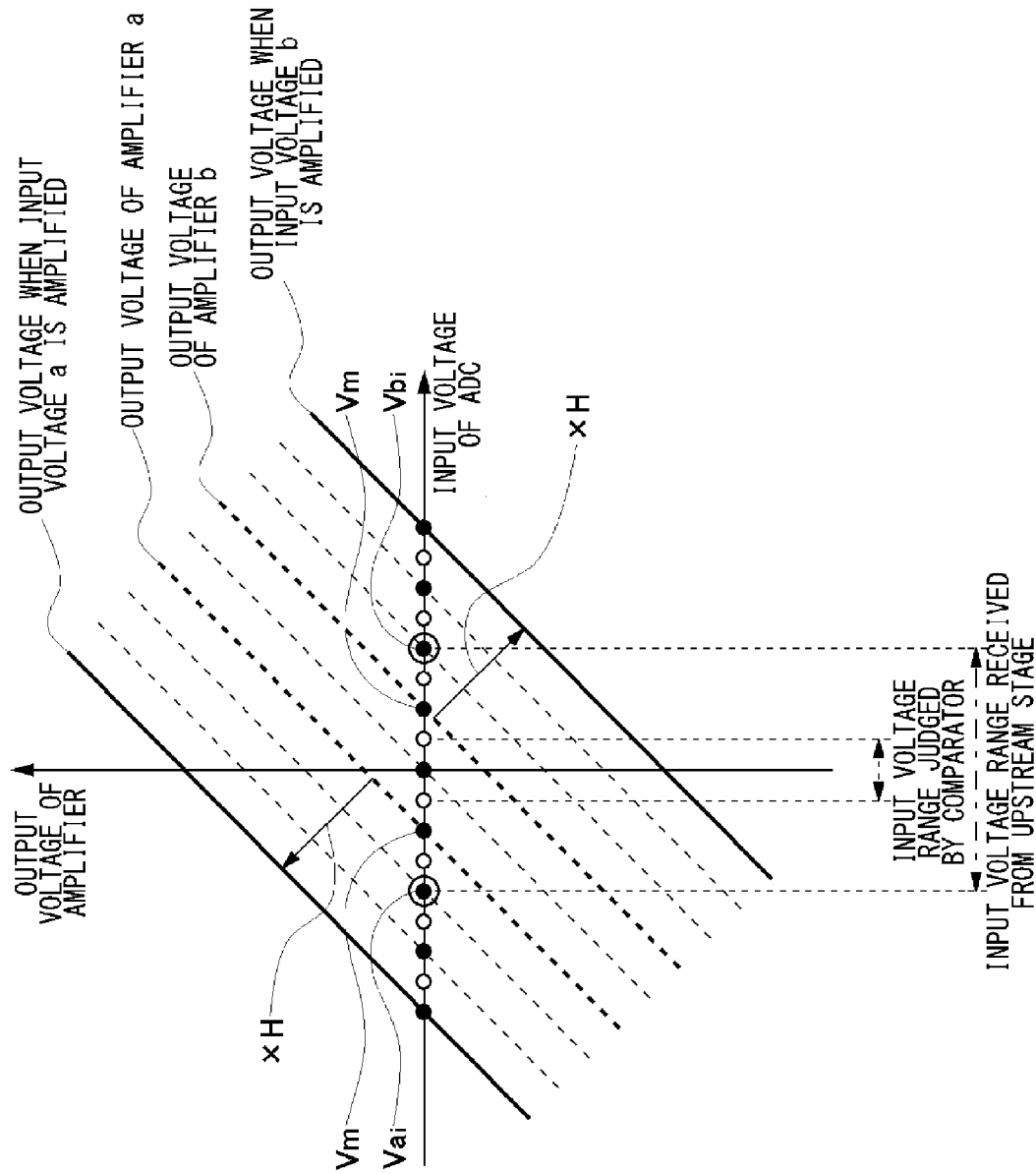
FIG. 7 is a graph showing the input/output characteristics of the A/D converter.

First, description will be made regarding the function of the B-type converter circuit UCB. The B-type converter circuit UCB is configured to alternately and repeatedly switch its state between the sampling state φ0 and the interpolation amplification state φ1. FIG. 6 is a diagram for describing the function of the B-type converter circuit UCB. FIG. 7 is a graph showing the input/output characteristics of the A/D converter 100.

As described above, the input voltages $Vi_a$ and $Vi_b$ generated by the upstream-stage A-type converter circuit UCA are voltage converted such that the input voltage VI matches the common voltage Vc. Thus, in the sampling state φ0, the B-type converter circuit UCB is configured to divide the range between the two input voltages $Vi_a$ and $Vi_b$ into multiple segments $SEG_1$ through $SEG_7$, and to judge which one from among the multiple segments SEG the common voltage Vc (GND) belongs to. The length of each segment SEG is set to the same voltage difference ΔV represented by the following Expression (17).

$$\Delta V = (Vi_b - Vi_a)/L \tag{17}$$

Here, L represents an integer of 2 or more. As described above, the difference between the two voltages $Vi_a$ (Va) and $Vi_b$ (Vb) received from the upstream stage is represented by Expression (8). Thus, the segment length ΔV of each segment SEG is represented by the following Expression (18), which means that the segment length ΔV is proportional to the initial reference voltage $V_{ref}$.

$$\Delta V = G \times 2\alpha/M \cdot V_{ref}/L \tag{18}$$

When Expression (8a) holds true, the following Expression (18a) holds true.

$$\Delta V = V_{ref}/L \tag{18a}$$

FIG. 6 shows an arrangement in which L=8. The B-type converter circuit UCB is configured to perform sampling (quantization) using the input voltages $Vi_a$ and $Vi_b$ without utilizing the reference voltages $V_{ref}$ and $-V_{ref}$ received from an external circuit, which is one of the features of the B-type converter circuit UCB.

When the common voltage Vc (GND) belongs to the j-th segment $SEG_j$, the B-type converter circuit UCB outputs the conversion data D2 which indicates the value j. FIG. 6 shows a state in which the ground voltage GND belongs to the fourth segment $SEG_0$ (j=4).

The sampling performed by the B-type converter circuit UCB is equivalent to judgment of which segment the input voltage VI belongs to when the range between the two offset voltages ($k_a \times V_{ref}/M$) and ($k_b \times V_{ref}/M$) is divided into multiple segments.

When the phase of the clock signal is switched in the next stage, the B-type converter circuit UCB is switched to the interpolation amplification state φ1. In the interpolation amplification state φ1, the B-type converter circuit UCB outputs the seventh voltage (first output voltage) $Vo_a$ and the eighth voltage (second output voltage) $Vo_b$, which are represented by the following Expressions (19a) and (19b), respectively.

$$Vo_a = -H \times Vm_a$$

$$Vm_a = \{(L - j_a) \cdot Vi_a + j_a \cdot Vi_b\}/L \tag{19a}$$

$$Vo_b = -H \times Vm_b$$

$$Vm_b = \{(L - j_b) \cdot Vi_a + Vi_b \cdot Vi_b\}/L \tag{19b}$$

Here, $j_a$ and $j_b$ are integers determined according to the conversion value j. For example, the values $j_a$ and $j_b$ may be determined as follows using an integer parameter β (β≥1).

$$j_a = (j - \beta) \tag{20a}$$

$$j_b = (j + \beta) \tag{20b}$$

Specifically, an arrangement may be made in which 0=1.

The fifth voltage (which will be referred to as the "first intermediate voltage") $Vm_a$, which appears in Expression (19a), is configured to provide internal division of the range between the two input voltages $Vi_a$ and $Vi_b$ with a ratio of $(j_a:(L-j_a))$. On the other hand, the sixth voltage (which will be referred to as the "second intermediate voltage") $Vm_b$, which appears in Expression (19b), is configured to provide internal division of the range between the two input voltages $Vi_a$ and $Vi_b$ with a ratio of $(j_b:(L-j_b))$.

The B-type converter circuit UCB is configured to determine the internal division points $j_a$ and $j_b$ such that the segment $SEG_j$ to which the common voltage Vc (GND) belongs is sandwiched between the two intermediate voltages $Vm_a$ and $Vm_b$. Furthermore, the B-type converter circuit UCB is configured to perform inverting amplification of the two intermediate voltages $Vm_a$ and $Vm_b$ with a gain of −H with the common voltage Vc as the base so as to generate the output voltages $Vo_a$ and $Vo_b$. FIG. 6 shows an arrangement in which H=4.

Directing attention to the difference between the two output voltages $Vo_a$ and $Vo_b$, the following Expression (21) holds true based upon the Expressions (19a) and (19b).

$$Vo_b - Vo_a = -H \times \{(j_a - j_b) \cdot Va_i + (j_b - j_a) \cdot Vb_i\}/L \tag{21}$$

By substituting the Expressions (20a) and (20b) into the Expression (21), the following Expression (22) is obtained.

$$Vo_b - Vo_a = -H \times \{-2\beta \cdot (Vb_i - Va_i)\}/L \tag{22}$$

By substituting the Expression (8) into the Expression (22), the following Expression (23) is obtained.

$$VO_b - Vo_a = -H \times \{-2\beta \cdot G \times 2\alpha/M \cdot V_{ref}\}/L \tag{23}$$

When the Expressions β=1, H=4, G×2α/M=1, and L=8 hold true, the Expression $Vo_b - Vo_a = V_{ref}$ holds true. That is to say, the input voltage range set for each downstream B-type converter circuit UCB is set to a uniform value.

The B-type converter circuits configured as the second stage and the subsequent stages are each configured to repeatedly perform the same processing. As a result, such an arrangement is capable of providing high-resolution A/D conversion by means of pipeline processing.

Figure 8:
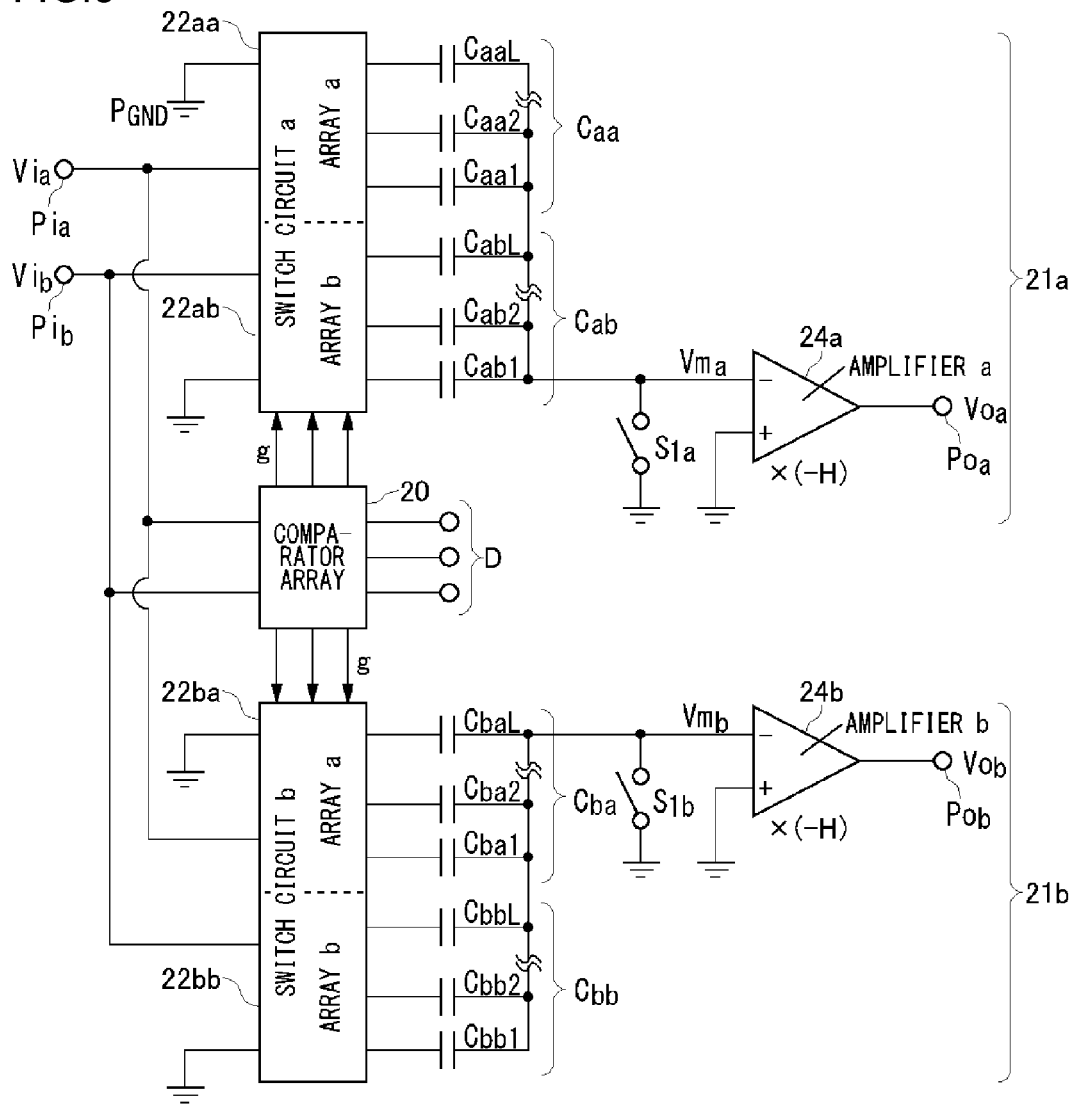
FIG. 8 is a circuit diagram which shows a configuration of the B-type converter circuit.

The above is the function of the B-type converter circuit UCB. Next, description will be made regarding the configuration of the B-type converter circuit UCB configured to provide such a function. FIG. 8 is a circuit diagram which shows a configuration of the B-type converter circuit UCB.

The B-type converter circuit UCB includes a second sub-A/D converter 20, a third amplifier circuit 21a configured to generate the seventh voltage (first output voltage) $Vo_a$, and a fourth amplifier circuit 21b configured to generate the eighth voltage (second output voltage) $Vo_b$.

In the sampling state φ0, the second sub-A/D converter 20 is configured to divide the range between the negative input voltage (fifth voltage) $Vi_a$ and the positive input voltage (sixth voltage) $Vi_b$ into multiple segments $SEG_0$ through $SEG_8$, and to judge which segment SEG the common voltage Vc (GND) belongs to. The second sub-A/D converter 20 is configured to output the conversion data D2 which represents the value j when the common voltage Vc (GND) belongs to the j-th segment $SEG_j$.

The configuration of the second sub-A/D converter 20 is not restricted in particular. Rather, various kinds of known or prospectively available techniques may preferably be employed. The second sub-A/D converter 20 may be configured to generate multiple threshold voltages $Vth_1$ through $Vth_8$ by dividing the voltage difference between the two input voltages $Vi_a$ and $Vi_b$ as shown in FIG. 6, and to compare the ground voltage GND with the respective threshold voltages $Vth_1$ through $Vth_8$ so as to perform sampling processing. In this case, the second sub-A/D converter 20 may be configured as a comparator array. As such a second sub-A/D converter 20, a comparator described in Non-patent document 1 or 2 proposed by the present inventor may be employed.

The third amplifier circuit 21a is configured to amplify the difference between the common voltage Vc and the fifth voltage $Vm_a$ having a voltage level that is equal to or greater than the upper limit of the segment to which the common voltage Vc belongs, with the common voltage Vc as the base voltage, thereby generating the seventh voltage $VO_a$.

Similarly, the fourth amplifier circuit 21b is configured to amplify the difference between the common voltage Vc and the sixth voltage $Vm_b$ having a voltage level that is equal to or smaller than the lower limit of the segment to which the common voltage Vc belongs, with the common voltage Vc as the base voltage, thereby generating the eighth voltage $VO_b$.

The seventh voltage $VO_a$ and the eighth voltage $VO_b$ thus generated are respectively used as the third voltage $Vi_a$, and the fourth voltage $Vi_b$ to be supplied to the downstream stage.

Directing attention to the third amplifier circuit 21a, description will be made regarding the configuration thereof.

The third amplifier circuit 21a includes a third switch circuit $22_{aa}$, a fourth switch circuit $22_{ab}$, a third amplifier 24a, a third capacitor array $C_{aa1}$ through $C_{aaL}$, a fourth capacitor array $C_{ab1}$ through $C_{abL}$, and a third switch $S_{1a}$. The fourth amplifier circuit 21b includes a fifth switch circuit $22_{ba}$, a sixth switch circuit $22_{bb}$, a fourth amplifier 24b, a fifth capacitor array $C_{ba1}$ through $C_{baL}$, a sixth capacitor array $C_{bb1}$ through $C_{bbL}$, and a fourth switch $S_{1b}$. The third amplifier circuit 21a and the fourth amplifier circuit 21b each have the same configuration.

The third amplifier 24a is configured as an inverting amplifier having a gain of (–H).

The third switch $S_{1a}$ is arranged between the inverting input terminal of the third amplifier 24a and the fixed voltage terminal (ground terminal). The third switch $S_{1a}$ is configured to switch on in the sampling state $\phi 0$, and to switch off in the interpolation amplification state $\phi 1$.

The capacitors $C_{aa1}$ through $C_{aaL}$ that form the third capacitor array and the capacitors $C_{ab1}$ through $C_{abL}$ that form the fourth capacitor array are arranged such that one terminal (first terminal) of each of the capacitors is connected together to the inverting input terminal of the third amplifier 24a. Description will be made below assuming that the capacitances of the capacitors $C_{aa1}$ through $C_{aaL}$ and $C_{ab1}$ through $C_{abL}$ are each set to a uniform value $C_0$.

The third switch circuit $22_{aa}$ and the fourth switch circuit $22_{ab}$ are each configured to receive the sampling result obtained by the first sub-A/D converter 10, i.e., the conversion data D which represents the value j, or otherwise a control signal that corresponds to the conversion data D. The third switch circuit $22_{aa}$ and the fourth switch circuit $22_{ab}$ are each configured as a switch matrix including multiple switches therewithin.

In the sampling state $\phi 0$, the third switch circuit $22_{aa}$ connects the other terminal (second terminal) of each of the capacitors $C_{aa1}$ through $C_{aaL}$ that form the third capacitor array to the first input terminal $Pi_a$, and the fourth switch circuit $22_{ab}$ connects the other terminal (second terminal) of each of the capacitors $C_{ab1}$ through $C_{abM}$ that form the fourth capacitor array to the second input terminal $Pi_b$. As a result, the third capacitor array $C_{aa}$ is charged by the first input voltage $Vi_a$, and the fourth capacitor array $C_{ab}$ is charged by the second input voltage $Vi_b$.

In the interpolation amplification state $\phi 1$, the third switch circuit $22_{aa}$ connects the second terminal of each of $(L-j_a)$ capacitors selected from among the L capacitors $C_{aa1}$ through $C_{aaL}$ that form the third capacitor array to the fixed voltage terminal (ground terminal), and switches the other $j_a$ capacitors to the open state or otherwise to the short-circuit state.

In the interpolation amplification state $\phi 1$, the fourth switch circuit $22_{ab}$ connects the second terminal of each of $j_a$ capacitors selected from among L capacitors $C_{ab1}$ through $C_{abL}$ that form the fourth capacitor array to the fixed voltage terminal (ground terminal $P_{GND}$), and switches the other $(L-j_a)$ capacitors to the open state or otherwise to the short-circuit state. In this state, the charge amount Q at the inverting input terminal of the third amplifier 24a is represented by the following Expression (24a).

$$Q = -C_0 \cdot Vi_a \cdot (L-j_a) - C_0 \cdot Vi_b \cdot j_a \qquad (24a)$$

With such an arrangement, the capacitance Ctot is represented by the following Expression (25)

$$Ctot = L \cdot C_0 \qquad (25)$$

Thus, the electric potential $Vm_a$ at the inverting input terminal of the third amplifier 24a is represented by the following Expression (26b), which matches Expression (19a).

$$Vm_a = Q/Ctot = \{(L-j_a) \cdot Vi_a + j_a \cdot Vi_b\}/L \qquad (26a).$$

The third amplifier 24a is configured to perform inverting amplification of the electric potential $Vm_a$ at the inverting input terminal with a gain (–H), and to output the amplified voltage as the first output voltage $VO_a$ via the first output terminal $Po_a$.

$$Vo_a = (-H) \times Vm_a \qquad (27)$$

Description will be made regarding the fourth amplifier circuit 21b. In the sampling state $\phi 0$, the fifth switch circuit $22_{ba}$ connects the other terminal (second terminal) of each of the capacitors $C_{ba1}$ through $C_{baL}$ that form the fifth capacitor array to the first input terminal $Pi_a$, and the sixth switch circuit $22_{bb}$ connects the other terminal (second terminal) of each of the capacitors $C_{bb1}$ through $C_{bbL}$ that form the sixth capacitor array to the second input terminal $Pi_b$. As a result, the fifth capacitor array $C_{ba}$ is charged by the first input voltage $Vi_a$, and the sixth capacitor array $C_{bb}$ is charged by the second input voltage $Vi_b$.

In the interpolation amplification state $\phi 1$, the fifth switch circuit $22_{ba}$ connects the second terminal of each of $(L-j_b)$ capacitors from among the L capacitors $C_{ba1}$ through $C_{baL}$ that form the fifth capacitor array to the fixed voltage terminal (ground terminal $P_{GND}$), and switches the other $j_b$ capacitors to the open state or otherwise the short-circuit state.

In the interpolation amplification state $\phi 1$, the sixth switch circuit $22_{bb}$ connects the second terminal of each of $j_b$ capacitors from among L capacitors $C_{bb1}$ through $C_{bbL}$, that form the sixth capacitor array to the fixed voltage terminal (ground terminal $P_{GND}$), and switches the other $(L-j_b)$ capacitors to the open state or otherwise the short-circuit state. In this state, the charge amount Q at the inverting input terminal of the fourth amplifier 24b is represented by the following Expression (24b).

$$Q = -C_0 \cdot Vi_a \cdot (L-j_b) - C_0 \cdot Vi_b \cdot j_b \qquad (24b)$$

Thus, the electric potential $Vm_b$ at the fourth amplifier 24b is represented by the following Expression (26b), which matches the Expression (19b).

$$Vm_b = Q/Ctot = \{(L-j_b) \cdot Vi_b + j_b \cdot Vi_b\}/L \quad (26b).$$

The above is the configuration of the B-type converter circuit UCB.

With the A/D converter 100 according to the embodiment, such an arrangement requires only a low gain on the order of 2 to 8 as the gain G of the A-type converter circuit UCA and the gain H of the B-type converter circuit UCB. Furthermore, unlike conventional arrangements, such an arrangement does not require severe gain accuracy. Thus, as such an amplifier, an open-loop type wideband amplifier may be employed without utilizing negative feedback. In a case in which an arrangement employing a negative feedback system is made, there is a need to give sufficient consideration to the circuit stability (occurrence of oscillation), leading to an increase in the difficulty of design, and to a problem of increased settling time. In contrast, the A/D converter 100 according to the embodiment can be configured as an open-loop system, thereby solving such a problem. Thus, such an arrangement provides a high-speed and high-precision A/D converter in a simple manner even if fine CMOS techniques are employed.

It is needless to say that, if such problems involved in employing a negative feedback circuit can be solved, a negative-feedback amplifier may be employed in the A/D converter 100 according to the embodiment.

Description will be made below regarding modifications of the A/D converter 100.

[First Modification]

Figure 9:
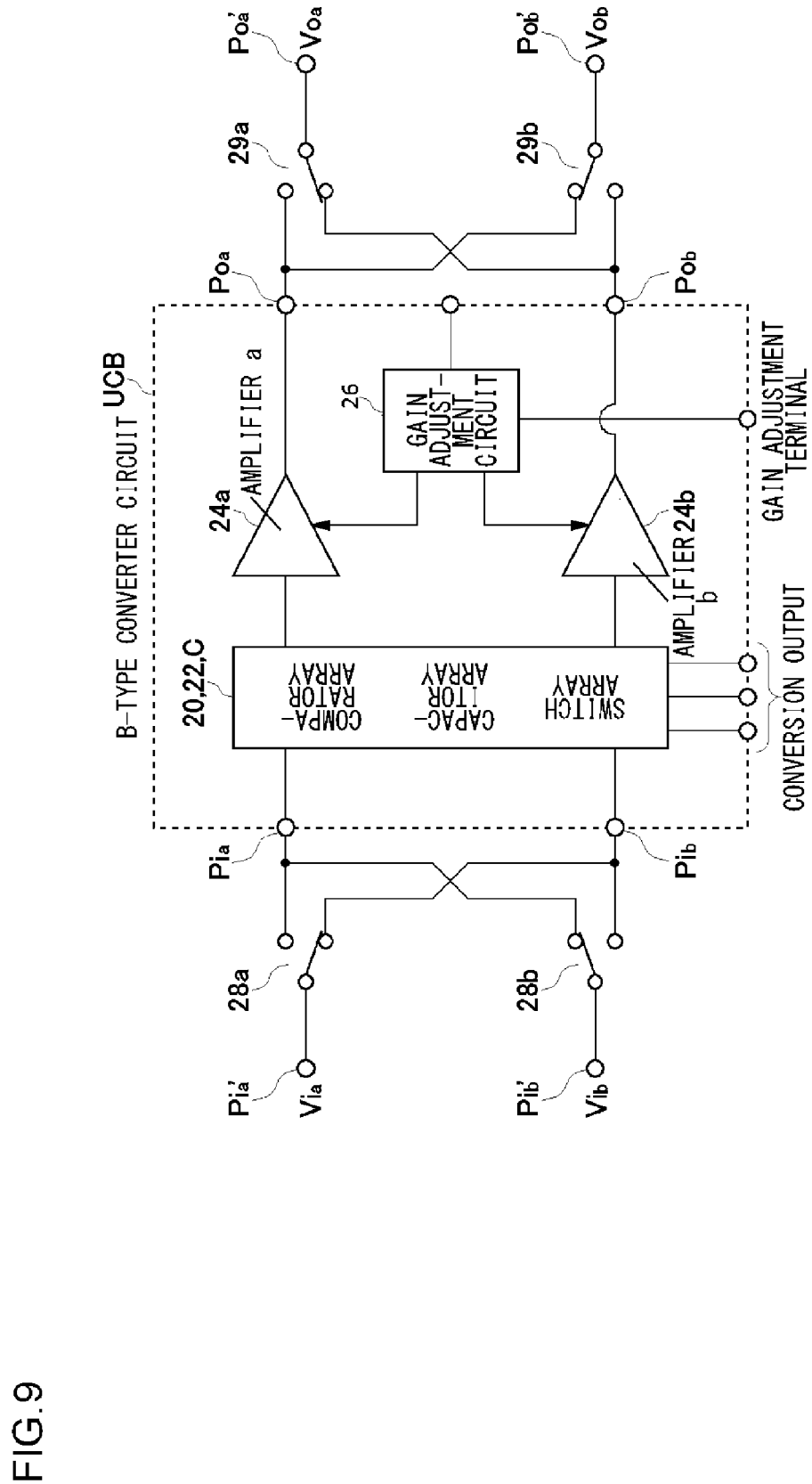
FIG. 9 is a circuit diagram which shows a configuration of a B-type converter circuit according to a modification.

FIG. 9 is a circuit diagram which shows a configuration of a B-type converter circuit according to a modification. As described above, with the A/D converter 100 according to the embodiment, as compared with conventional arrangements, such an arrangement requires only low precision of the amplifier gain. However, such an arrangement requires a certain degree of relative precision for the gain H of each of the third amplifier 24a and the fourth amplifier 24b that belong to the same converter circuit. In general, it is well known that such relative precision can be obtained using semiconductor circuit techniques (e.g., pairing of the corresponding circuit elements, etc.). In a case in which such an arrangement requires higher relative precision, the circuit shown in FIG. 9 is effectively employed.

The B-type converter circuit UCB shown in FIG. 9 further includes a gain adjustment circuit 26, in addition to the components of the B-type converter circuit UCB shown in FIG. 8. The third amplifier 24a and the fourth amplifier 24b are each configured as a variable gain amplifier. The gain adjustment circuit 26 is configured to digitally adjust the gain H of each of the third amplifier 24a and the fourth amplifier 24b, thereby reducing linearity error.

Also, a method may be effectively made in which differential amplification processing is performed while swapping the third amplifier 24a and the fourth amplifier 24b, in addition to or otherwise instead of the adjustment performed by the gain adjustment circuit 26. Input switches 28a and 28b are configured to swap the two input terminals $Pi_a$ and $Pi_b$ of the B-type converter circuit UCB to which the input voltages $Vi_a$ and $Vi_b$ are to be input. Similarly, the output switches 29a and 29b are configured to swap the two output terminals $Po_a'$ and $Po_b'$ via which the voltages output via the output terminals $Po_a$ and $Po_b$ of the B-type converter circuit UCB are to be output.

In a case in which the gain of the third amplifier 24a is equal to the gain of the fourth amplifier 24b, the conversion characteristics are maintained at a constant value even if swapping is performed. In a case in which there is a mismatch between the gains, by making a combination with the gain adjustment circuit 26, such an arrangement provides conversion characteristics matching.

[Second Modification]

Description has been made assuming that the offset voltage of each amplifier is zero. However, in actuality, such an amplifier has a certain amount of offset voltage, which degrades the precision. Thus, such an arrangement requires a countermeasure. With a second modification, by modifying the switching operation of the amplifier, such a second modification provides a solution for solving the problem due to the offset voltage.

Figure 10:
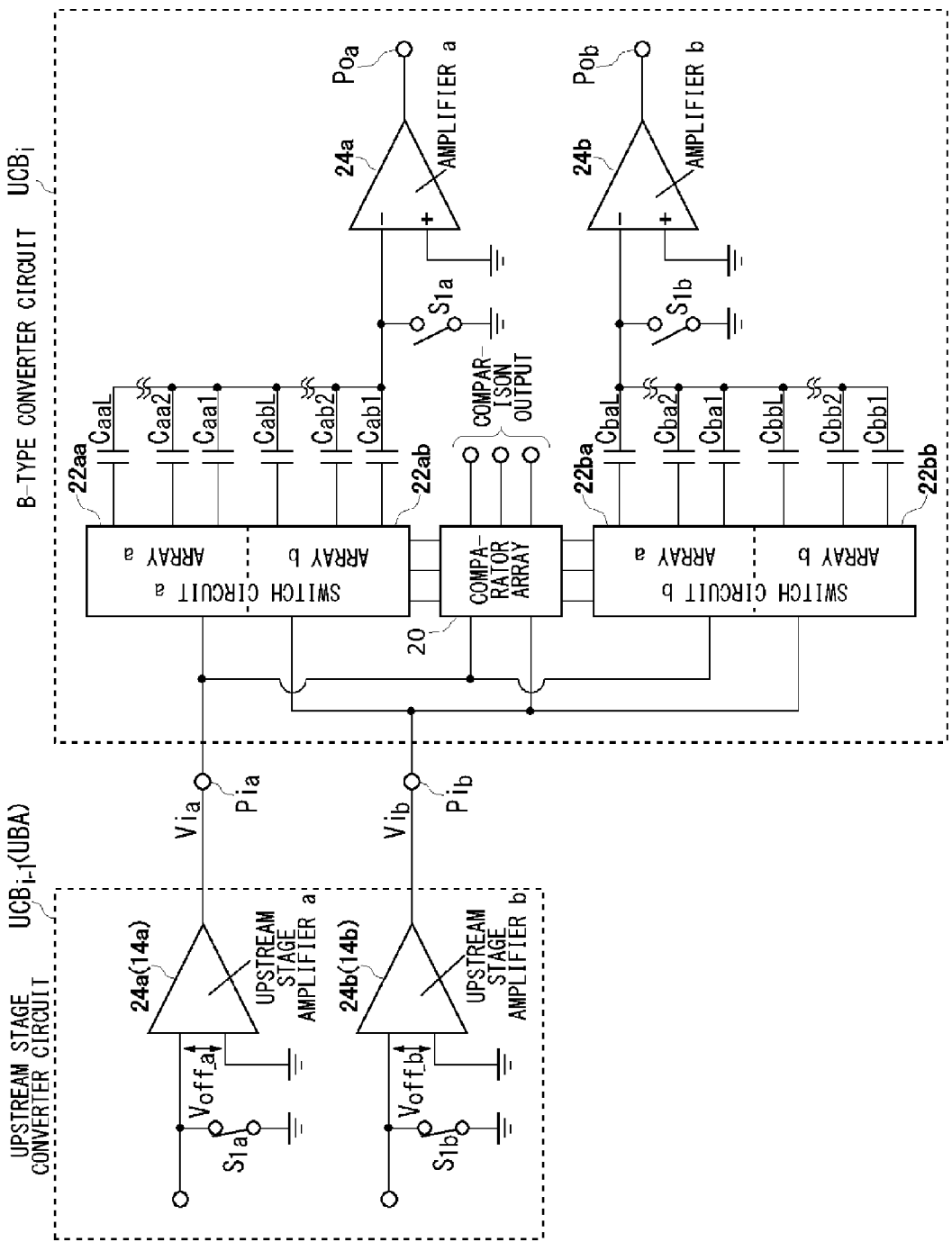
FIG. 10 is a circuit diagram which shows a configuration of a B-type converter circuit according to a second modification.

FIG. 10 is a circuit diagram which shows a configuration of a B-type converter circuit according to a second modification. In the arrangement shown in FIG. 8, the switch circuits $22_{aa}$, $22_{ab}$, $22_{ba}$, and $22_{bb}$ are configured to apply the ground voltage GND to the capacitor array $C_{aa}$, $C_{ab}$, $C_{ba}$, and $C_{bb}$. In contrast, in the modification shown in FIG. 10, the switch circuits $22_{aa}$, $22_{ab}$, $22_{ba}$, and $22_{bb}$ are configured to apply the input voltages $Vi_a$ and $Vi_b$, which are received from the upstream stage, to the capacitor array $C_{aa}$, $C_{ab}$, $C_{ba}$, and $C_{bb}$.

Figure 11B:
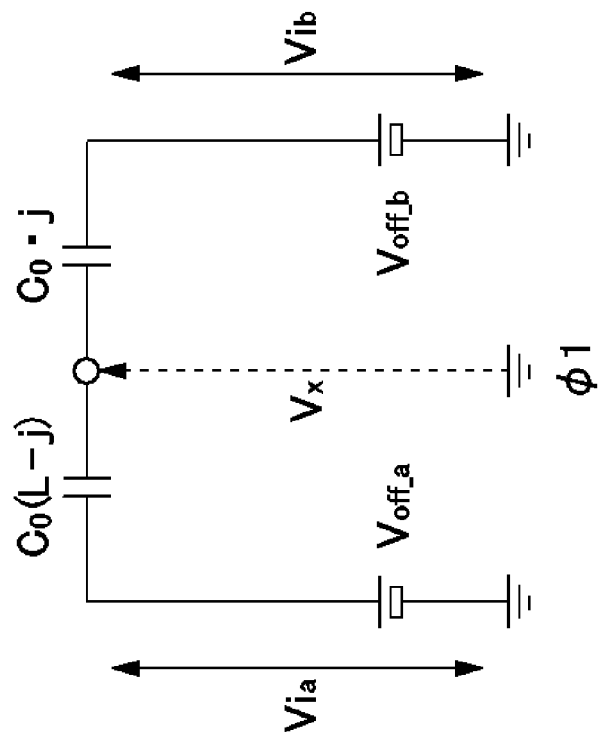
FIGS. 11A and 11B are diagrams for describing the operation of the B-type converter circuit shown in FIG. 10.
Figure 11A:
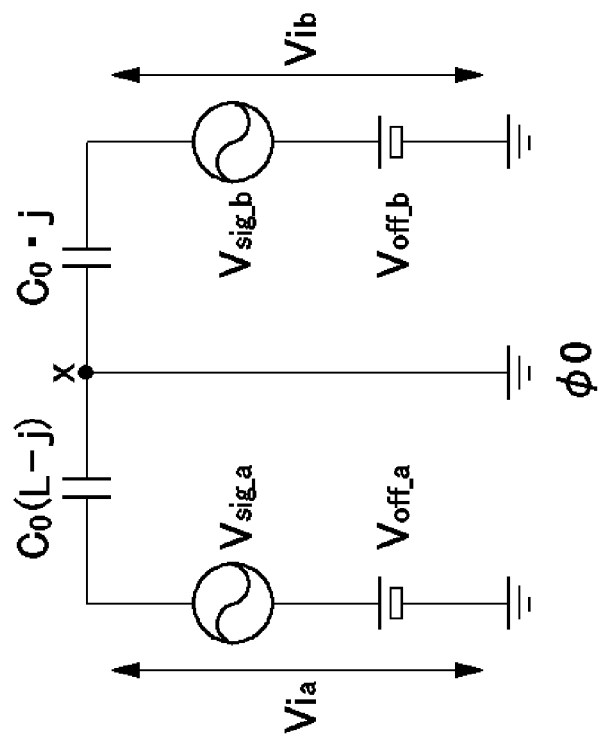

FIGS. 11A and 11B are diagrams for describing the operation of the B-type converter circuit shown in FIG. 10. FIG. 11A shows the sampling state $\phi 0$, and FIG. 11B shows the interpolation state $\phi 1$.

Description will be made with reference to FIG. 11A. When the B-type converter circuit $UCB_i$, which is a device of interest, is in the sampling state $\phi 0$, the immediately upstream stage is in the interpolation amplification state $\phi 1$. In this state, the switches $S_{1a}$ and $S_{1b}$ included in the immediately upstream stage are each off. When the third amplifier 24a (14a) and the fourth amplifier 24b (14b) of the immediately upstream stage have offset voltages $V_{off\_a}$ and $V_{off\_b}$, respectively, the voltages $Vi_a$ and $Vi_b$ received from the immediately upstream stage are equal to voltages obtained by superimposing the offset voltages $V_{off\_a}$ and $V_{off\_b}$ on the signal components $V_{sig\_a}$ and $V_{sig\_b}$, respectively. In the B-type converter circuit $UCB_i$, the capacitor arrays are charged by $(V_{sig\_a} + V_{off\_a})$ and $(V_{sig\_b} + V_{off\_b})$. Thus, the charge amount stored at the node x is represented by the following Expression (27).

$$Q_x = -(V_{sig\_a} + V_{off\_a}) \cdot C_0 \cdot (L-j) - (V_{sig\_b} + V_{off\_b}) \cdot C_0 \cdot j \quad (27)$$

Subsequently, the B-type converter circuit $UCB_a$ of interest transits to the interpolation amplification state $\phi 1$. In this state, the converter circuit of the immediately upstream stage enters the sampling state in which the switches $S_{1a}$ and $S_{1b}$ are each turned on. In this state, the input voltages $Vi_a$ and $Vi_b$ of the B-type converter circuit $UCB_i$ are set to the offset voltages $V_{off\_a}$ and $V_{off\_b}$, respectively. In the interpolation amplification state $\phi 1$ shown in FIG. 11B, the following relation Expression (28) holds true. Here, $V_x$ represents the voltage at the node x.

$$(V_x - V_{off\_a}) \cdot C_0 \cdot (L-j) + (V_x + V_{off\_b}) \cdot C_0 \cdot j = Q_x = \\ -(V_{sig\_a} + V_{off\_a}) \cdot C_0 \cdot (L-j) - (V_{sig\_b} + V_{off\_b}) \cdot C_0 \cdot j \quad (28)$$

Thus, the following Expression (29) holds true.

$$(-V_{off\_a}) \cdot C_0 \cdot (L-j) + (V_x + V_{off\_b}) \cdot C_0 \cdot j = Q_x$$

$$V_x = -\{V_{sig\_a} \cdot (L-j) + V_{sig\_b} \cdot j\}/L \quad (29)$$

Thus, such an arrangement is capable of removing the effects of the offset voltages $V_{off\_a}$ and $V_{off\_b}$, thereby providing high-precision A/D conversion.

[Third Modification]

Description has been made above regarding an embodiment employing a single-ended amplifier. Also, a differential amplifier can be employed in such an arrangement, which can be clearly understood by those skilled in this art.

Figure 12B:
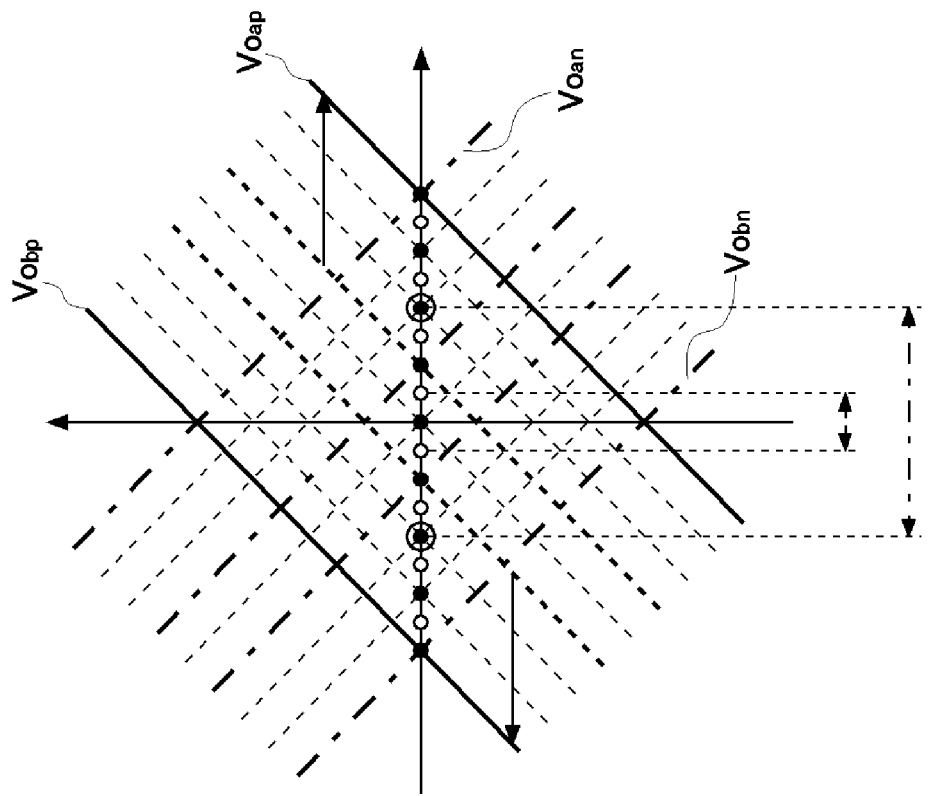
FIGS. 12A and 12B are graphs showing the input/output characteristics of the A-type converter circuit and the B-type converter circuit employing such differential amplifiers.
Figure 12A:
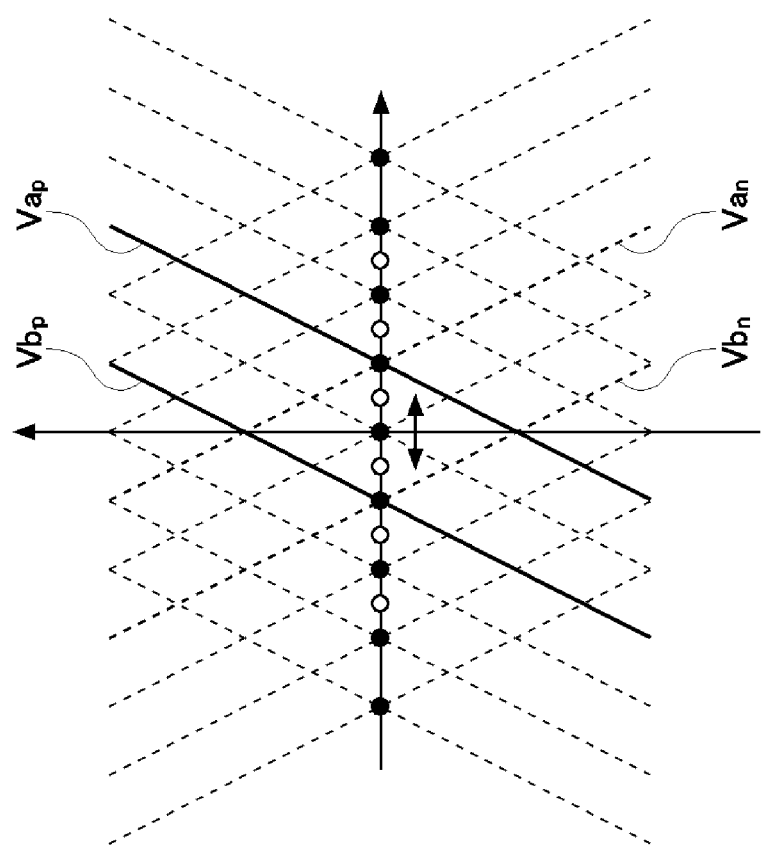

FIGS. 12A and 12B are graphs showing the input/output characteristics of the A-type converter circuit and the B-type converter circuit employing such differential amplifiers.

Figure 13:
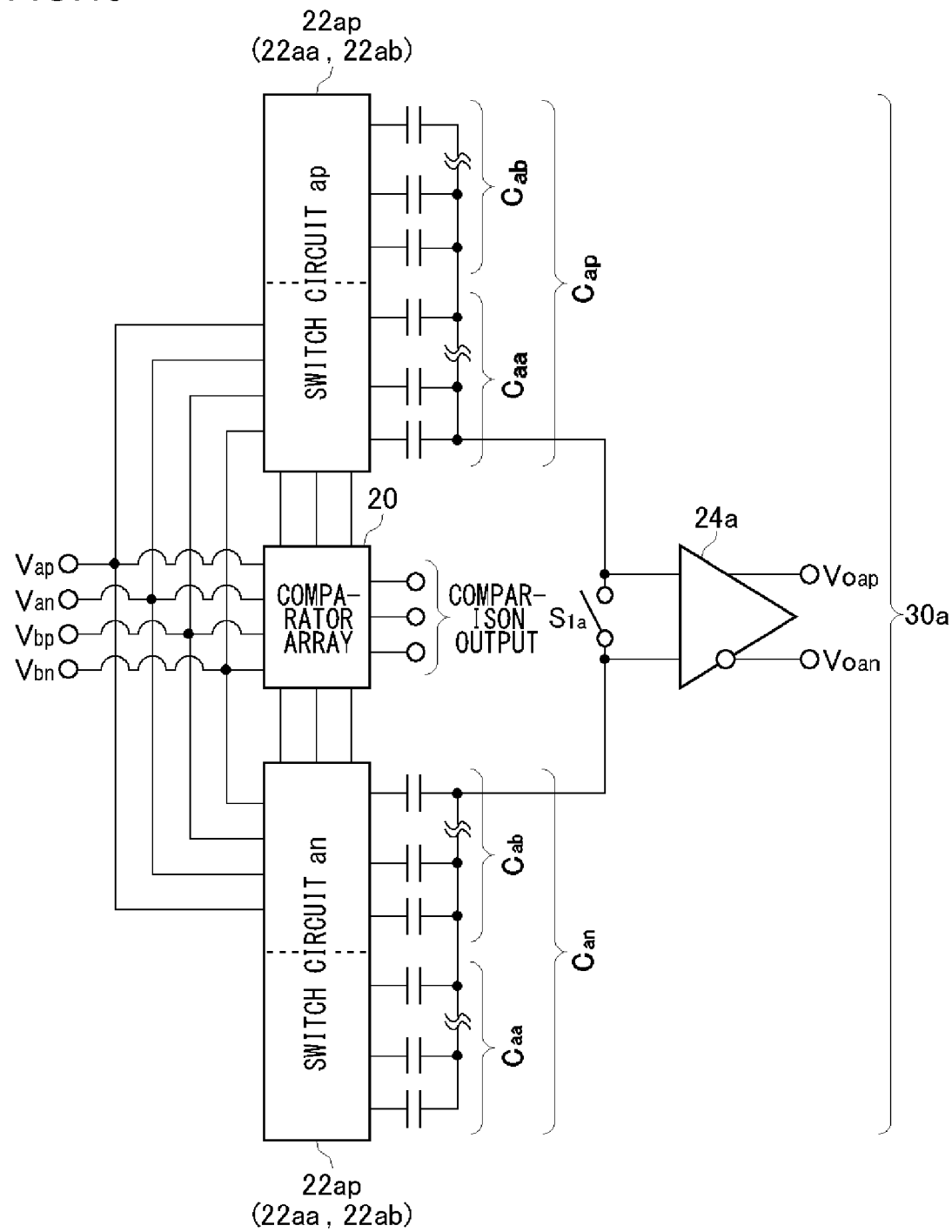
FIG. 13 is a circuit diagram which shows a part of a configuration of a B-type converter circuit according to a third modification.
Figure 14:
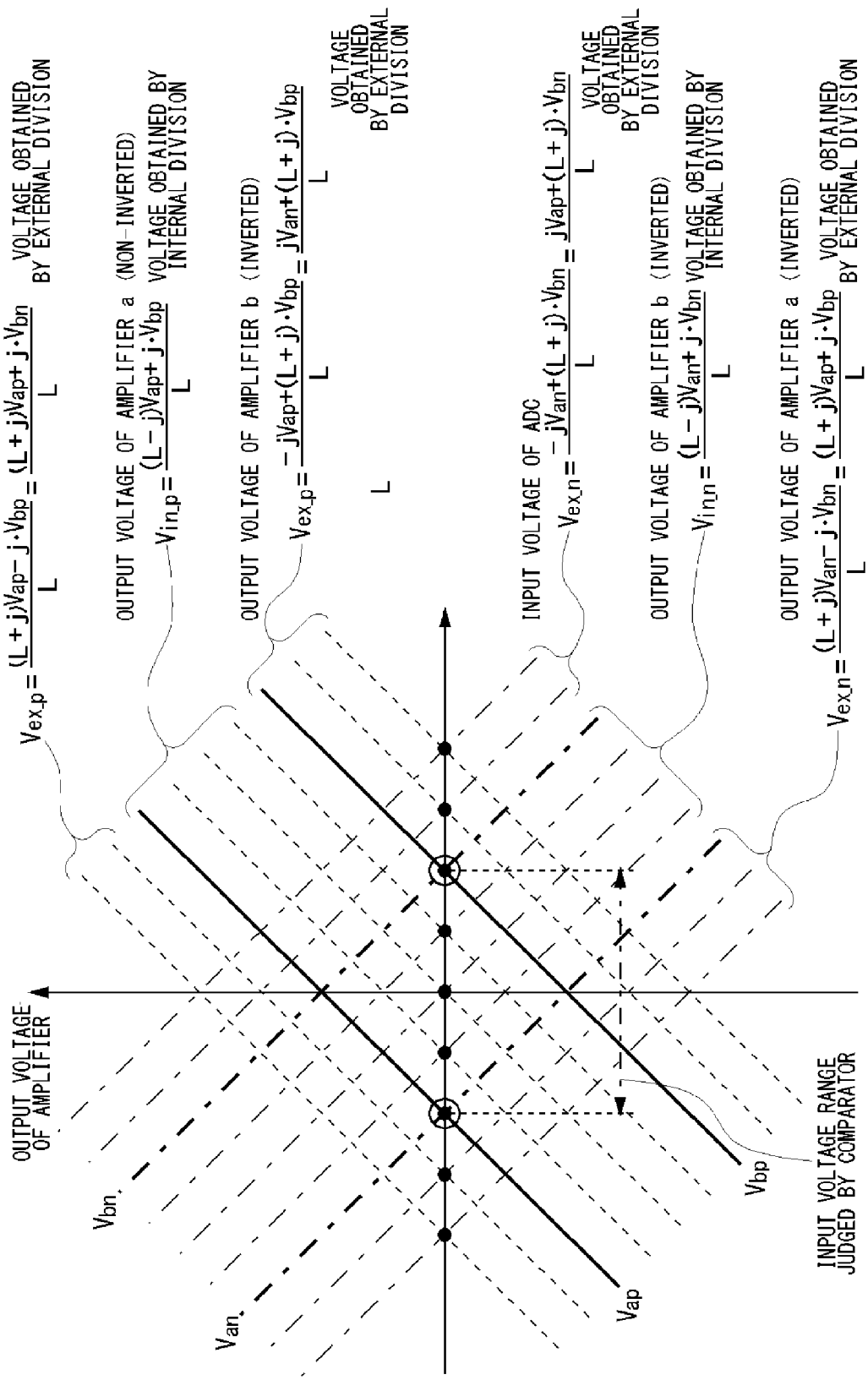
FIG. 14 is a diagram which shows the input/output characteristics of the B-type converter circuit shown in FIG. 13.

Such an arrangement employing such a differential circuit is capable of providing an inverted signal with the common voltage Vc as the center, thereby enabling an external division method (extrapolation) to be employed, in addition to an internal division method (interpolation) described in the embodiment. FIG. 13 is a circuit diagram which shows a part of a configuration of a B-type converter circuit according to a third modification. FIG. 13 shows only a third amplifier circuit 21a that corresponds to the amplifier a. FIG. 14 is a diagram which shows the input/output characteristics of the B-type converter circuit shown in FIG. 13.

With the configuration shown in FIG. 8, such an arrangement is capable of providing only lines $V_{in\_p}$ that are within a range between the lines $V_{ap}$ and $V_{bp}$ indicated by the heavy lines in FIG. 14. In contrast, with such a configuration shown in FIG. 13, such an arrangement is capable of providing lines $V_{ex\_p}$ outside of the range between the lines $V_{ap}$ and $V_{bp}$.

The B-type converter circuit UCB shown in FIG. 13 is configured to receive first input voltages $Vi_{ap}$ and $Vi_{an}$ as a differential signal, and second input voltages $Vi_{bp}$ and $Vi_{bn}$ as a differential signal. The third amplifier circuit 21a included in the B-type converter circuit UCB includes a second sub-A/D converter 20, third switch circuits $22_{ap}$ and $22_{an}$, a third amplifier 24a, a capacitor array $C_{ap}$ and $C_{an}$, and a switch $S_{1a}$.

The switch $S_{1a}$ is arranged between the input terminals of the third amplifier 24a.

The capacitor array $C_{ap}$ includes a third capacitor array $C_{aa1}$ through $C_{aaL}$ and a fourth capacitor array $C_{ab1}$ through $C_{abL}$. The capacitor array $C_{an}$ has a similar configuration.

The third switch circuits $22_{ap}$ and $22_{an}$ are each configured as a matrix switch, and are respectively configured to charge the capacitor arrays $C_{ap}$ and $C_{an}$ according to a control signal received from the second sub-A/D converter 20.

In a case in which the voltage is to be generated by means of an internal division method, in the sampling state φ0, the third switch circuit $22_{ap}$ is preferably configured to apply the non-inverted input voltage $V_{ap}$ to the capacitor array $C_{aa}$, and to apply the non-inverted input voltage $V_{bp}$ to the capacitor array $C_{ab}$. Furthermore, in this state, the third switch circuit $22_{ap}$ is preferably configured to apply the inverted input voltage $V_{an}$ to the capacitor array $C_{ba}$, and to apply the inverted input voltage $V_{bn}$ to the capacitor array $C_{bb}$. Such an operation is equivalent to the operation performed by the configuration shown in FIG. 8 By means of such an internal division method, such an arrangement is capable of generating the voltages $V_{in\_p}$ and $V_{in\_n}$.

$$V_{in\_p} = \{(L-j) \cdot V_{ap} + j \cdot V_{bp}\}/L \tag{30p}$$

$$V_{in\_n} = \{(L-j) \cdot V_{an} + j \cdot V_{bn}\}/L \tag{30n}$$

In a case in which the voltage is to be generated by means of an external division method, in the sampling state φ0, the third switch circuit $22_{ap}$ may be preferably configured to apply the non-inverted input voltage $V_{ap}$ to the capacitor array $C_{aa}$, and to apply the inverted input voltage $V_{bn}$ to the capacitor array $C_{ab}$.

In the interpolation amplification state φ1, (L+j) capacitors of the third capacitor array $C_{aa}$ are each grounded, and j capacitors of the fourth capacitor array $C_{ab}$ are each grounded, whereby a voltage occurs at the input terminal of the third amplifier 24a, which is represented by the following Expression (31p).

$$V_{ex\_p} = \{(L+j) \cdot V_{ap} + j \cdot V_{bn}\}/L \tag{31p}$$

Here, the relation $V_{bn} = -V_{bp}$ holds true, and accordingly Expression (31p) can be transformed into the following Expression (31p).

$$V_{ex\_p} = \{(L+j) \cdot V_{ap} - j \cdot V_{bp}\}/L \tag{31p}$$

That is to say, the voltage $V_{ex\_p}$ corresponds to a point obtained by performing external division of a range between the two voltages $V_{ap}$ and $V_{bp}$ at a ratio of (j:(L+j)).

The third switch circuit $22_{an}$ may be preferably configured to apply the inverted input voltage $V_{an}$ to the capacitor array $C_{ba}$, and to apply the inverted input voltage $V_{bn}$ to the capacitor array $C_{bb}$. As a result, the voltage $V_{ex\_n}$ represented by the following Expression (31n) is obtained.

$$V_{ex\_n} = \{(L+j) \cdot V_{an} - j \cdot V_{bn}\}/L \tag{31n}$$

That is to say, the voltage $V_{ex\_n}$ corresponds to a point obtained by performing external division of a range between the two inverted voltages $V_{an}$ and $V_{bn}$ at a ratio of (j:(L+j)).

That is to say, with the B-type converter circuit UCB shown in FIG. 13, the voltage to be applied to the capacitor array is preferably extended so as to be capable of providing an inverted voltage (n), and the number of capacitors is preferably increased as needed. With such an arrangement employing such an external division method, such an arrangement allows the designer to further reduce the gain H of each of the third amplifier 24a and the fourth amplifier 24b.

Description has been made in the embodiment regarding an arrangement in which the common voltage Vc is set to the ground voltage GND. However, the present invention is not restricted to such an arrangement. In a case in which it is desired to operate the circuit in a positive voltage range, the common voltage Vc may be set to the midpoint voltage Vdd/2 of the power supply voltage Vdd. Alternatively, in a case in which a reference voltage $V_{ref}$ is supplied, the common voltage may be set to $V_{ref}/2$.

As described above, such an arrangement requires relative precision of the gain (−G) between the first amplifier 14a and the second amplifier 14b that belong to the same converter circuit. However, such an arrangement does not require absolute precision of the gain for the first amplifier 14a and the second amplifier 14b. Furthermore, such an arrangement requires only a low gain on the order of ten or less, or otherwise at most several tens, which is another advantage. The same can be said of the third amplifier 24a and the fourth amplifier 24b. Accordingly, description will be made regarding a preferable configuration of a dynamic differential amplifier having such characteristics.

Figure 15:
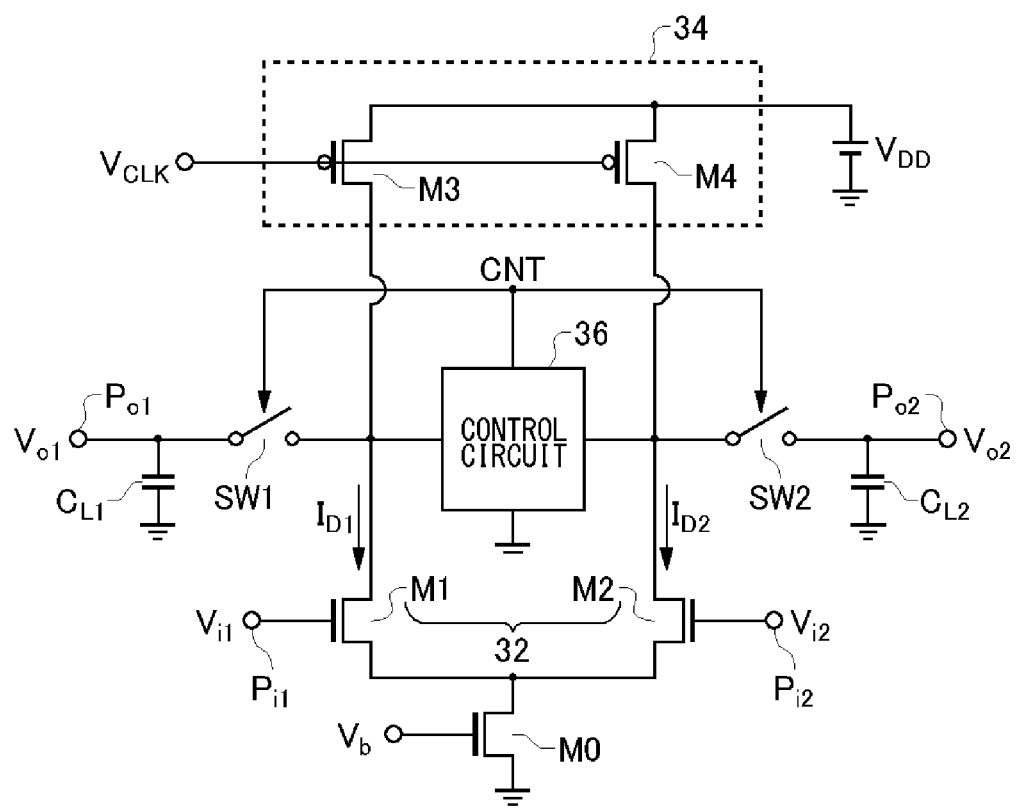
FIG. 15 is a circuit diagram which shows a configuration of a dynamic differential amplifier.

FIG. 15 is a circuit diagram which shows a configuration of a dynamic differential amplifier 30. The dynamic differential amplifier 30 is configured to amplify signals $V_{i1}$ and $V_{i2}$ respectively input to the first input terminal $P_{i1}$ and the second input terminal $P_{i2}$, and to output the amplified signals as signals $V_{o1}$ and $V_{o2}$ via the first output terminal $P_{o1}$ and the second output terminal $P_{o2}$.

The dynamic differential amplifier 30 includes a first load capacitor $C_{L1}$, a second load capacitor $C_{L2}$, an input differential pair 32, an initializing circuit 34, a control circuit 36, and a tail current source M0.

The first load capacitor $C_{L1}$ is arranged between the first output terminal $P_{o1}$ and the fixed voltage terminal (ground terminal). The second load capacitor $C_{L2}$ is arranged between the second output terminal $P_{o2}$ and the ground terminal.

The initializing circuit 34 is configured to initialize the charge amount stored in the first load capacitor $C_{L1}$ and the second load capacitor $C_{L2}$. The initializing circuit 34 includes initializing transistors M3 and M4, for example. The initializing transistor M3 is arranged between the first load capacitor $C_{L1}$ and the second fixed voltage terminal (power supply terminal). Similarly, the initializing transistor M4 is arranged between the second load capacitor $C_{L2}$ and the power supply terminal. The on/off operations of the initializing transistors M3 and M4 are each controlled in synchronization with a control clock $V_{CLK}$ that transits to low level at a predetermined cycle. When the initializing transistors M3 and M4 are turned on, the first load capacitor $C_{L1}$ and the second load capacitor $C_{L2}$ are charged by the power supply voltage $V_{DD}$, thereby initializing the charge amount stored in each load capacitor.

The input differential pair 32 includes an input transistor M1 and an input transistor M2. The input transistor M1 is arranged such that the first load capacitor $C_{L1}$ functions as a load, and such that the first input signal $V_{i1}$ is input via its control terminal (gate). Similarly, the input transistor M2 is arranged such that the second load capacitor $C_{L2}$ functions as a load, and such that the second input signal $V_{i2}$ is input via its gate. The tail current source M0 is configured to supply an operation current (tail current) $I_0=I_{D1}+I_{D2}$ to the input differential pair 32.

When the midpoint voltage $(V_{o1}+V_{o2})/2$ of the electric potentials $V_{o1}$ and $V_{o2}$ that respectively occur at the first output terminal $P_{o1}$ the second output terminal $P_{o2}$ reaches a predetermined threshold voltage Vth, the control circuit 36 disconnects the charging/discharging path for the first load capacitor $C_{L1}$ and the second load capacitor $C_{L2}$.

In order to provide a function for disconnecting the charging/discharging path for the first load capacitor $C_{L1}$ and the second load capacitor $C_{L2}$, a first switch SW1 and a second switch SW2 are arranged. The first switch SW1 is arranged between the load capacitor $C_{L1}$ and the input transistor M1. The second switch SW2 is arranged between the second load capacitor $C_{L2}$ and the input transistor M2.

The control circuit 36 is configured to switch the on/off states of the first switch SW1 and the second switch SW2, thereby switching the connection/disconnection state of the charging/discharging path for the first load capacitor $C_{L1}$ and the second load capacitor $C_{L2}$.

Figure 16:
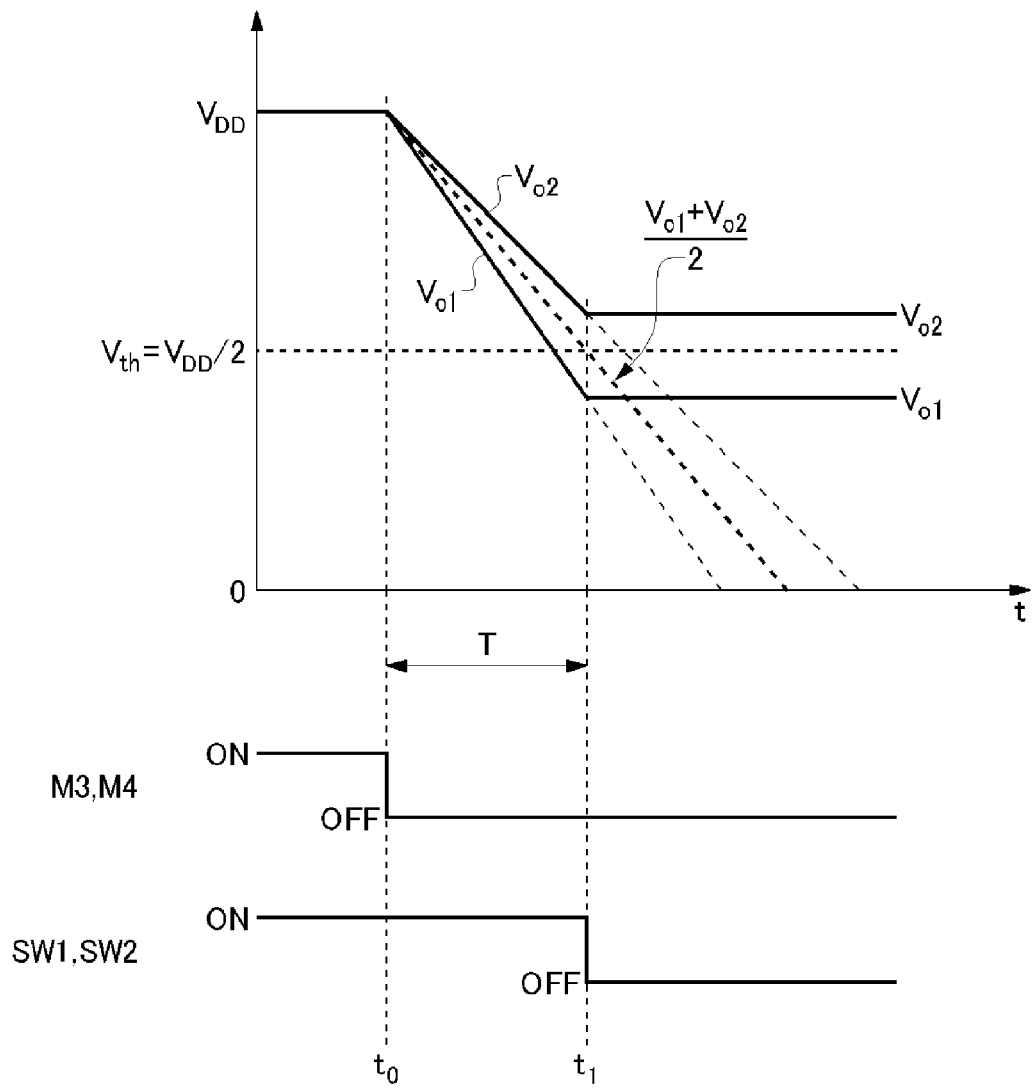
FIG. 16 is a waveform diagram showing the operation of the dynamic differential amplifier shown in FIG. 15.

The above is the basic configuration of the dynamic differential amplifier 30. Next, description will be made regarding the operation thereof. FIG. 16 is a waveform diagram showing the operation of the dynamic differential amplifier 30 shown in FIG. 15. The horizontal axis represents time, and the vertical axis represents the output voltages $V_{o1}$ and $V_{o2}$.

1. Initializing State.

Before the amplification, the dynamic differential amplifier 30 is set to the initializing state ($t<t_0$). In the initializing state, the control clock $V_{CLK}$ is set to low level, and the initializing transistors M3 and M4 are each turned on. Furthermore, the control circuit 36 turns on the first switch SW1 and the second switch SW2. As a result, the power supply voltage $V_{DD}$ is applied to the first load capacitor $C_{L1}$ and the second load capacitor $C_{L2}$, thereby initializing the output voltages $V_{o1}$ and $V_{o2}$ to the power supply voltage $V_{DD}$.

2. Amplification State.

When the control clock $V_{CLK}$ is switched to high level, the initializing transistors M3 and M4 are each turned off, and the state is switched to the amplification state ($t_0<t<t_1$). In the amplification state, a current $I_{D1}$ that corresponds to the input voltage $V_{i1}$ and a current $I_{D2}$ that corresponds to the input voltage $V_{i2}$ flow through the input transistors M1 and M2, respectively. With the transconductance of the input transistor M1 and the input transistor M2 as $g_m$, and with the tail current as $I_0$, the currents $I_{D1}$ and $I_{D2}$ are represented by the following Expressions (32a) and (32b), respectively.

$$I_{D1}=I_0/2+g_m\times(V_{i1}-V_{i2})/2 \tag{32a}$$

$$I_{D2}=I_0/2-g_m\times(V_{i1}-V_{i2})/2 \tag{32b}$$

It should be noted that the relation Expression $I_0=I_{D1}+I_{D2}$ holds true.

With the time elapsed from the start of the amplification as t, the output voltages $V_{o1}$ and $V_{o2}$ are represented by the following Expressions (33a) and (33b), respectively.

$$V_{o1}=V_{DD}-I_{D1}/C_{L1}\cdot t \tag{33a}$$

$$V_{o2}=V_{DD}-I_{D2}/C_{L2}\cdot t \tag{33b}$$

The control circuit 36 is configured to monitor the midpoint voltage $V_x=(V_{o1}+V_{o2})/2$ of the output voltages $V_{o1}$ and $V_{o2}$. When the midpoint voltage $V_x$ thus monitored reaches a predetermined threshold voltage Vth at the time point $t_1$, the control circuit 36 turns off the first switch SW1 and the second switch SW2. Assuming that the first load capacitor $C_{L1}$ and the second load capacitor $C_{L2}$ each have the same capacitance $C_L$, the midpoint voltage $V_x$ is represented by the following Expression (34).

$$V_x=V_{DD}-I_0\times t/(2\times C_L) \tag{34}$$

In a case in which the threshold voltage Vth is set to the midpoint voltage $V_{DD}/2$ of the power supply voltage, the period T is represented by the following Expression (35).

$$T=C_L\times V_{DD}/I_0 \tag{35}$$

In this case, the output voltages $V_{o1}$ and $V_{o2}$ are represented by the following Expressions (36a) and (36b), respectively.

$$V_{o1}=V_{DD}/2-g_{m1}/2\times(V_{i1}-V_{i2})/I_0\times V_{DD} \tag{36a}$$

$$V_{o2}=V_{DD}/2-g_{m2}/2\times(V_{i1}-V_{i2})I_0\times V_{DD} \tag{36b}$$

Thus, the differential gain G of the dynamic differential amplifier 30 is represented by the following Expression (37).

$$\begin{aligned}G &= (V_{o1}-V_{o2})/(V_{i1}-V_{i2}) \\ &= -(g_{m1}-g_{m2})/2\times V_{DD}/(I_{D1}+I_{D2})\end{aligned} \tag{37}$$

The transconductance of the input transistor M1 and the transconductance of the input transistor M2 are represented by the following Expressions (38a) and (38b), respectively.

$$g_{m1}=2\times I_{D1}/V_{eff} \tag{38a}$$

$$g_{m2}=2\times I_{D2}/V_{eff} \tag{38b}$$

The relation Expressions are substituted into the Expression (37), thereby obtaining the following Expression (39).

$$G=-V_{DD}/V_{eff} \tag{39}$$

It should be noted that $V_{eff}$ is represented by $V_{eff}=V_{GS}-Vt$. Here, $V_{GS}$ represents the gate-source voltage, and Vt represents the gate-source threshold voltage of the MOSFET.

The energy consumption required for the dynamic differential amplifier 30 shown in FIG. 15 to perform amplification once is represented by the following Expression (40).

$$E_c=Q\cdot V_{DD}=2\cdot I_D\cdot T\cdot V_{DD}\cdot C_L\cdot V_{DD}^2 \tag{40}$$

Thus, with the cyclic frequency as $f_c$, power consumption $P_d$ is represented by the following Expression (41)

$$P_d=f_c\cdot E_c=f_c\cdot C_L\cdot V_{DD}^2 \tag{41}$$

Figure 17:
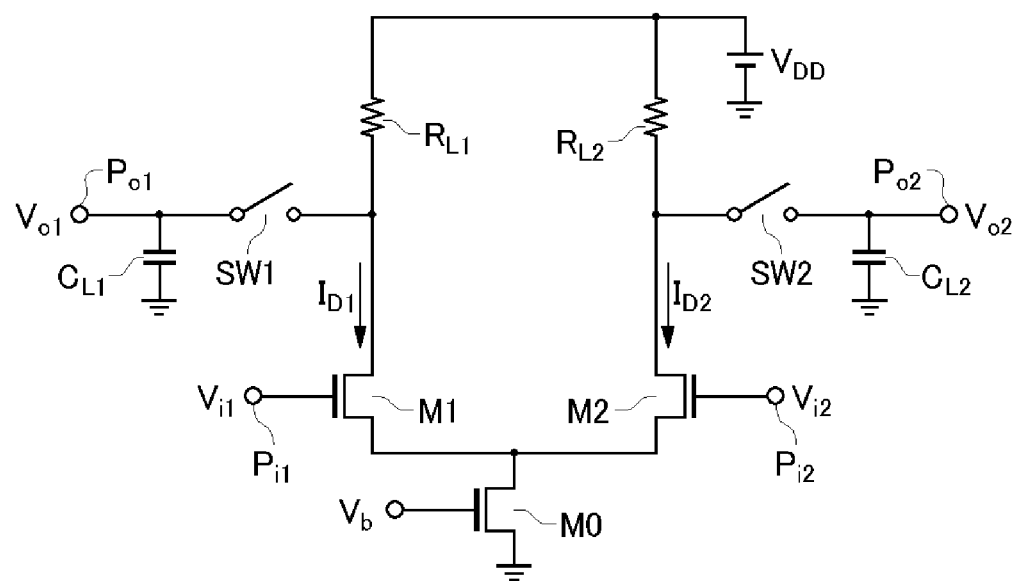
FIG. 17 is a circuit diagram which shows a configuration of an amplifier according to a comparison technique.

The advantage of the dynamic differential amplifier 30 shown in FIG. 15 can be clearly understood by comparison with the amplifier shown in FIG. 17. FIG. 17 is a circuit diagram which shows a configuration of an amplifier 1030 according to a comparison technique. The amplifier 1030 includes load resistors $R_{L1}$ and $R_{L2}$, instead of the initializing circuit. Capacitors $C_{L1}$ and $C_{L2}$, and switches SW1 and SW2 are arranged in order to perform sampling of the drain voltages of the transistors M1 and M2. It should be noted that such a configuration provides a function that differs from that provided by the dynamic differential amplifier 30 shown in FIG. 15.

With such an amplifier 1030, the drain currents of the input transistors M1 and M2 steadily flow through the load resistors $R_{L1}$ and $R_{L2}$, respectively. In the bias state, the output voltages $V_{o1}$ and $V_{o2}$ are designed to be on the order of half the power supply voltage $V_{DD}$. Thus, the following Expression (42) holds true for the resistances $R_{L1}$ and $R_{L2}$.

$$R_L = V_{DD}/2I_D \tag{42}$$

Here, the relation Expressions $R_L = R_{L1} = R_{L2}$ and $I_D = (I_{D1} + I_{D2})/2$ hold true. Based upon the relation expression which represents the relation between the voltage and current in a saturation range of the MOS transistor, the transconductance $g_m$ of the transistors M1 and M2 is represented by the following Expression (43).

$$g_m = 2 \cdot I_D / V_{eff} \tag{43}$$

Thus, the differential gain G of this circuit is represented by the following Expression (44).

$$G = -g_m \cdot R_L = -V_{DD}/V_{eff} \tag{44}$$

That is to say, the dynamic differential amplifier 30 shown in FIG. 15 has the same gain as that of the amplifier 1030 shown in FIG. 17.

Description will be made regarding the power consumption of the amplifier shown in FIG. 17. Typically, the voltage $V_{eff}$ is on the order of 0.2 V. Thus, assuming that $V_{DD} = 1$ V, the gain is approximately 5. The time response of the amplifier 1030 is represented by the following Expression (45).

$$V_{o1} - V_{o2} = G \cdot (V_{i1} - V_{i2}) \cdot (1 - e^{1/\tau}) \tag{45}$$

where $\tau = R_L \cdot C_L$

Giving consideration to the fact that the constant current $(2 \cdot I_D)$ flows through this circuit, the power consumption $P_D$ of this circuit is represented by the following Expression (46).

$$P_D = 2 \cdot I_D \cdot V_{DD} = V_{DD}^2 / R_L = C_L \cdot V_{DD}^2 / \tau \tag{46}$$

As can be clearly understood from Expression (45), the response time constant $\tau$ of the amplifier 1030 is determined by the product of the resistance and the capacitance. Thus, in a case in which the response speed is to be raised, i.e., in a case in which the time constant $\tau$ is to be reduced, there is a need to reduce the resistance. However, if the resistance is reduced, the power consumption represented by Expression (46) increases in inverse proportion to the resistance.

Assuming that 1% settling time is required, the amplifier shown in FIG. 17 requires a period of time of at least $(5 \cdot \tau)$ as settling time for each half cycle. Thus, the power consumption $P_D$ is represented by the following Expression (47).

$$P_D = C_L \cdot V_{DD}^2 / \tau = 10 \cdot f_c \cdot C_L \cdot V_{DD}^2 \tag{47}$$

By making a comparison between the amplifier shown in FIG. 17 and the amplifier shown in FIG. 15, the advantage of the dynamic differential amplifier 30 shown in FIG. 15 can be clearly understood as follows.

First, with the dynamic differential amplifier 30 shown in FIG. 15, the power consumption $P_D$ is represented by Expression (41). Thus, it can be understood that the dynamic differential amplifier 30 shown in FIG. 15 has an advantage of low power consumption, which is on the order of 1/10 the power consumption $P_D$ of the amplifier 1030 shown in FIG. 17, which is represented by Expression (47).

With the circuit shown in FIG. 17, by designing the load resistor $R_L$ to have a resistance in inverse proportion to the cyclic frequency $f_c$, such an arrangement allows the power consumption to be reduced. However, it is difficult for such an arrangement to provide such a resistance value as a variable resistance which can be adjusted over a wide frequency range. Thus, such an arrangement is impractical. That is to say, in practice, such an arrangement requires a sufficiently low resistance $R_L$ so as to provide a sufficient response speed for the possible maximum cyclic frequency $f_{cmax}$. This leads to increased power consumption as represented by Expression (47). In contrast, with the configuration shown in FIG. 15, there is no relation between the power consumption and the operation current as represented by Expression (41). Thus, such an arrangement has an advantage in that the power consumption does not increase even if the operation current is increased in order to provide a high-speed operation. Furthermore, in a case in which the frequency $f_c$ is reduced, such an arrangement provides an amplifier which requires only very low power consumption to operate.

Next, description will be made regarding a more specific example configuration of the dynamic differential amplifier 30.

Figures 18A, 18B:
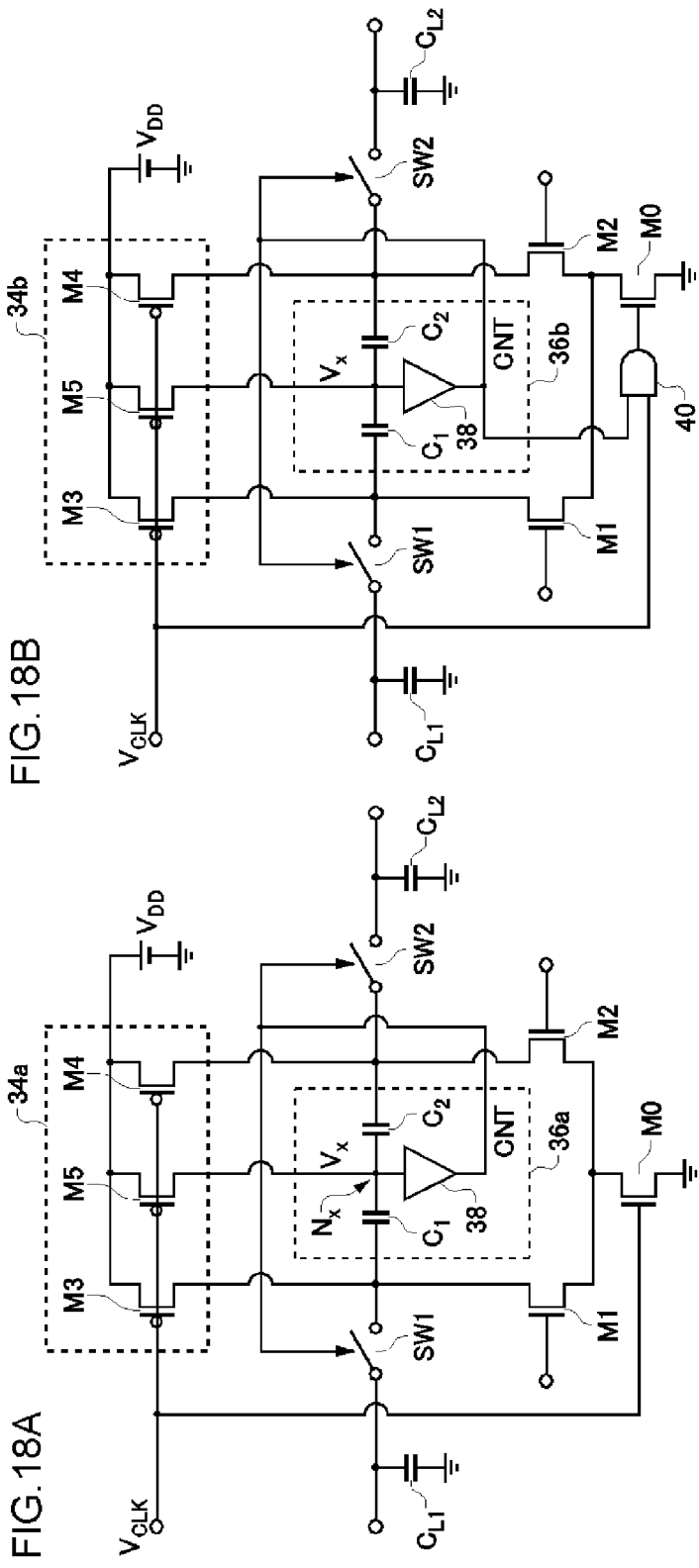
FIGS. 18A and 18B are circuit diagrams showing a specific example configuration of the dynamic differential amplifier shown in FIG. 15.

FIGS. 18A and 18B are circuit diagrams showing a specific example configuration of the dynamic differential amplifier 30 shown in FIG. 15.

With a dynamic differential amplifier 30a shown in FIG. 18A, a control circuit 36 includes a first dividing capacitor $C_1$, a second dividing capacitor $C_2$, and a comparator 38. The first dividing capacitor $C_1$ and the second dividing capacitor $C_2$ are arranged in series between the first output terminal $P_{o1}$ and the second output terminal $P_{o2}$. The first dividing capacitor $C_1$ and the second dividing capacitor $C_2$ each have the same capacitance $C_0$. The comparator 38 is configured to compare the electric potential V, at a connection node that connects the first dividing capacitor $C_1$ and the second dividing capacitor $C_2$ with a predetermined threshold voltage Vth, and to control switches SW1 and SW2 according to a signal that corresponds to the comparison result.

As shown in the lower circuit diagram in FIG. 18A, the comparator 38 may include inverters 39. Each inverter 39 is arranged to receive the power supply voltage $V_{DD}$ and the ground voltage GND, and is configured such that its threshold voltage Vth is set to $V_{DD}/2$. The number of inverter 39 stages is preferably designed according to the control logic of the switches SW1 and SW2.

An initializing circuit 34a is configured to initialize the electric potential $V_x$ at the connection node $N_x$ that connects the first dividing capacitor $C_1$ and the second dividing capacitor $C_2$ to the power supply voltage $V_{DD}$, in the same way as the first output terminal $P_{o1}$ and the second output terminal $P_{o2}$. Specifically, an initializing transistor M5 is arranged between the node $N_x$ and the power supply terminal. By turning on the initializing transistor M5, such an arrangement is capable of initializing the electric potential at the node N.

By performing initialization, the charge amounts of the capacitors $C_1$ and $C_2$ are each initialized to zero. After the pre-charge charge is released, amplification is started. When the output voltages $V_1$ and $V_2$ respectively develop at the first output terminal $P_{o1}$ and the second output terminal $P_{o2}$, the following Expression (48) holds true, assuming that parasitic capacitance can be ignored.

$$C_0 \cdot (V_x - V_1) = C_0 \cdot (V_x - V_2) \tag{48}$$

Expression (48) is solved for $V_x$, thereby obtaining the following Expression (49).

$$V_x=(V_1+V_2)/2 \quad (49)$$

That is to say, the electric potential V, at the connection node $N_x$ is equal to the midpoint voltage of the two output voltages $V_{o1}$ and $V_{o2}$. Thus, such an arrangement allows the midpoint voltage V to be compared with a threshold voltage in the same way as with the circuit shown in FIG. 15.

Furthermore, the control clock $V_{CLK}$ is input to the gate of the tail current source M0. Such an arrangement allows the tail current source M0 to be turned off in the initialization state, thereby further reducing power consumption.

A dynamic differential amplifier 30b shown in FIG. 18B includes a logical gate 40, in addition to the configuration of the dynamic differential amplifier 30a shown in FIG. 18A. The logical gate 40 is configured to supply the logical AND of the output signal CNT of the control circuit 36 and the control clock $V_{CLK}$ to the gate of the tail current source M0. With such a configuration, such an arrangement is capable of disconnecting the charging/discharging path for the first load capacitor $C_{L1}$ and the second load capacitor $C_{L2}$ in a surer manner than with an arrangement shown in FIG. 18A. Moreover, by turning off the tail current source M0, the electric potentials at the first output terminal $P_{o1}$ and the second output terminal $P_{o2}$ do not fall to the ground potential (0 V). Thus, such an arrangement is capable of further reducing power consumption in comparison with an arrangement shown in FIG. 18A.

Figure 19B:
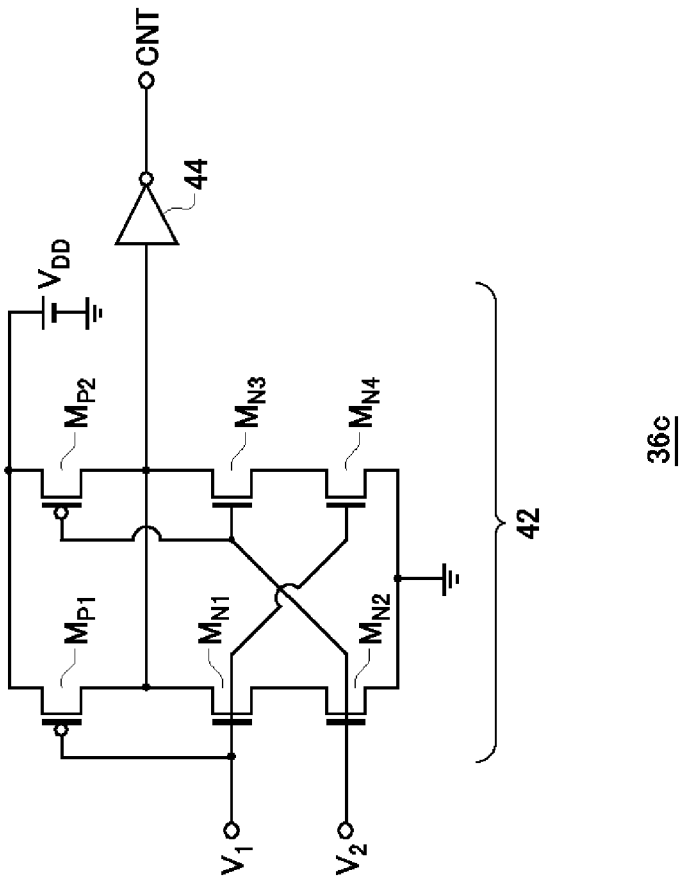
FIGS. 19A and 19B are circuit diagrams each showing another specific example of the dynamic differential amplifier.
Figure 19A:
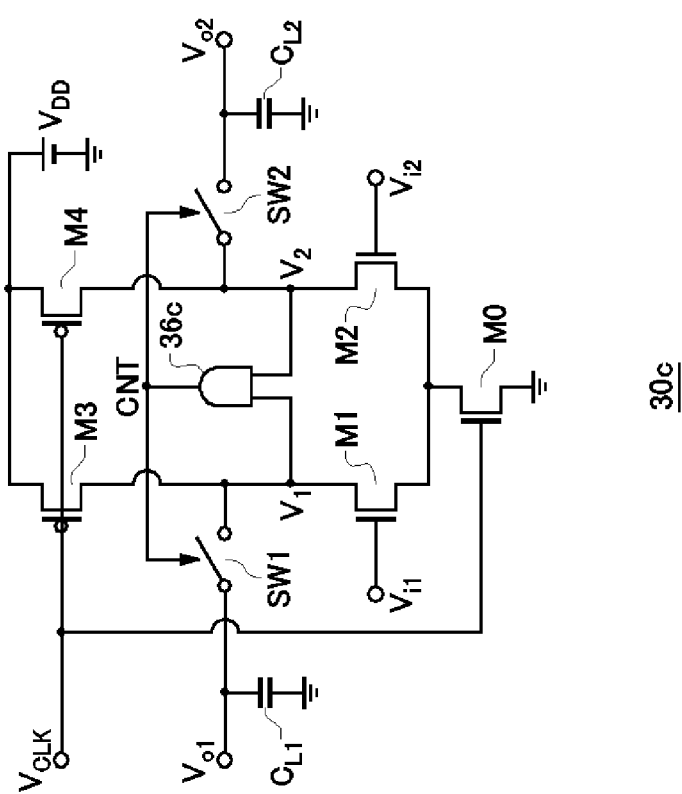

FIGS. 19A and 19B are circuit diagrams each showing another specific example of the dynamic differential amplifier. With a dynamic differential amplifier 30c shown in FIG. 19A, a control circuit 36c is configured as a logical gate. Specifically, the control circuit 36c is configured as an AND gate. FIG. 19B is a circuit diagram which shows a specific configuration of the control circuit 36c. The control circuit 36c includes a NAND gate 42 and an inverter (NOT gate) 44 arranged as a downstream stage of the NAND gate 42.

The NAND gate 42 includes P-channel transistors $M_{P1}$ and $M_{P2}$, and N-channel transistors $M_{N1}$, $M_{N2}$, $M_{N3}$, and $M_{N4}$. The first P-channel transistor $M_{P1}$, the first N-channel transistor $M_{N1}$, and the second N-channel transistor $M_{N2}$ are sequentially stacked between the power supply terminal and the ground terminal so as to form a first path. The second P-channel transistor $M_{P2}$, the third N-channel transistor $M_{N3}$, and the fourth N-channel transistor $M_{N4}$ are sequentially stacked between the power supply terminal and the ground terminal so as to form a second path arranged in parallel with the first path.

A first input signal $V_1$ is applied to the gates of the first P-channel transistor $M_{P1}$, the first N-channel transistor $M_{N1}$, and the fourth N-channel transistor $M_{N4}$. A second input signal $V_2$ is applied to the gates of the second P-channel transistor $M_{P2}$, the second N-channel transistor $M_{N2}$, and the third N-channel transistor $M_{N3}$. The output terminal of the NAND gate 42 is connected to the drains of the first P-channel transistor $M_{P1}$ and the second P-channel transistor $M_{P2}$.

With the average drain current of the N-channel transistor as $I_{DN}$, and with the average drain current of the P-channel transistor as $I_{DP}$, the voltage-current characteristics can be approximated by the following Expressions (50a) and (50b), assuming that such a transistor has a fine structure.

$$I_{DN}=K_N\cdot(V_{GS}-V_{TN}) \quad (50a)$$

$$I_{DP}=-K_P\cdot(V_{GS}-V_{TP}) \quad (50b)$$

When the total current that flows through the P-channel transistors is equal to the total current that flows through the N-channel transistors, the logical state of the output of the NAND gate 42 transits. Thus, the following Expressions (51a) and (51b) hold true.

$$I_{DN}=K_N\cdot(V_1-V_{TN})+K_N\cdot(V_2-V_{TN})=2\cdot K_N\cdot\{(V_1+V_2)/2-V_{TN}\} \quad (51a)$$

$$I_{DP}=K_P\cdot(V_{DD}-V_1-V_{TP})+K_P\cdot(V_{DD}-V_2-V_{TP})=2\cdot K_P\cdot\{-(V_1+V_2)/2+V_{DD}+V_{TP}\} \quad (51b)$$

Based upon the aforementioned Expressions, it can be understood that the input voltages $V_1$ and $V_2$ that provide $I_{DN}=I_{DP}$ satisfies the following relation Expression (52).

$$(V_1+V_2)/2=(K_N\cdot V_{TN}+K_P\cdot V_{TP})/(K_N+K_P)+K_P/(K_N+K_P)\cdot V_{DD} \quad (52)$$

Thus, it can be understood that the output logical state transits at the midpoint voltage of $V_1$ and $V_2$. As described above, by employing such a NAND gate 42 shown in FIG. 19B instead of the dividing capacitors $C_1$ and $C_2$, such an arrangement also allows the midpoint voltage to be compared with the threshold voltage Vth.

It should be noted that description has been made with reference to FIGS. 15 through 19 regarding an arrangement in which the input differential pair 32 has a configuration using N-channel MOSFETs. Also, the input differential pair 32 may be configured using P-channel MOSFETs. In this case, the power supply voltage and the ground voltage are preferably reversed, in addition to the N-channel transistors being replaced by P-channel transistors. Furthermore, the gate signal to be applied to each transistor may be preferably inverted as necessary.

Description has been made in the embodiment regarding an arrangement in which the charging/discharging path for the load capacitors $C_{L1}$ and $C_{L2}$ is disconnected according to the midpoint voltage $V_x$ of the output voltage $V_{o1}$ and $V_{o2}$. Also, the control circuit 36 may be configured as a timer circuit configured to count the time elapsed from the start of charging.

Figure 20:
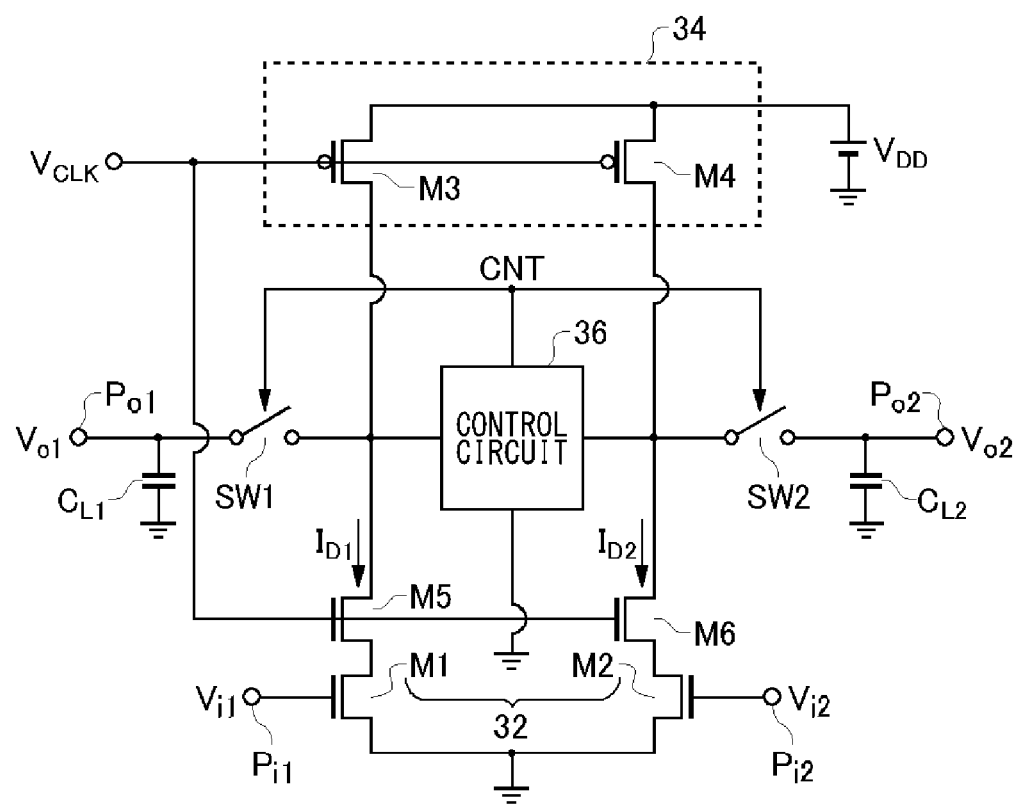
FIG. 20 is a circuit diagram which shows a modification of the dynamic differential amplifier shown in FIG. 15.

FIG. 20 is a circuit diagram which shows a modification of the dynamic differential amplifier 30 shown in FIG. 15. The dynamic differential amplifier 30 shown in FIG. 15 includes the tail current source M0 in order to set the operation current for the input transistors M1 and M2. Such an arrangement requires a drain-source voltage of 0.2 V or more for the tail current source M0, leading to difficulty in employing such a tail current source in a situation in which only a low power supply voltage $V_{DD}$ can be used. In order to solve such a problem, a dynamic differential amplifier 30d shown in FIG. 20 is configured as a pseudo-differential circuit having a configuration obtained by eliminating the tail current source M0 shown in FIG. 15. The dynamic differential amplifier 30d includes switch transistor M5 and M6, the on/off state of each of which is controlled in synchronization with the control clock $V_{CLK}$, on the respective drain sides of the input transistors M1 and M2. In the initialization state, the switch transistors M5 and M6 are each turned off. In the amplification state, the switch transistors M5 and M6 are each turned on.

With the dynamic differential amplifier 30d shown in FIG. 20, by controlling the gate voltages $V_{i1}$ and $V_{i2}$, such an arrangement is configured to control the operation currents of the input transistor M1 and the input transistor M2. The switching transistors M5 and M6 are each configured as a switch that switches between two states, i.e., an on state and an off state. Thus, in the operation state, the drain-source voltage Vds of each switching transistor is substantially zero. Thus, such an arrangement allows the dynamic differential amplifier 30d to operate even if the power supply voltage $V_{DD}$ is reduced by the drain-source voltage Vds (which is on the order of 0.2 V) that is required for the tail current source M0 shown in FIG. 15.

Also, an arrangement may be made in which the transistors M5 and M6 are eliminated from the configuration shown in FIG. 20, and the gate voltages $V_{i1}$ and $V_{i2}$ are controlled so as to turn off the input transistors M1 and M2, respectively, in a period in which they are to be turned off.

Also, the configuration shown in FIG. 20 and the configuration shown in FIG. 18B may be combined. With such an arrangement, the output of the gate 40 shown in FIG. 18B may be preferably input to the gates of the respective transistors M5 and M6 shown in FIG. 20.

The dynamic differential amplifiers described with reference to FIGS. 15 through 20 can be preferably employed in the aforementioned A/D converters. However, the usage thereof is not restricted in particular. Such a dynamic differential amplifier can be employed in various kinds of applications which do not require absolute gain precision, but which require relative gain precision, thereby providing an advantage of reduced power consumption.

Description has been made regarding the present invention with reference to the embodiment using specific terms. However, the above-described embodiments show only the mechanisms and applications of the present invention for exemplary purposes only, and are by no means intended to be interpreted restrictively. Rather, various modifications and various changes in the layout can be made without departing from the spirit and scope of the present invention defined in appended claims.

What is claimed is:

1. An A/D converting method for converting an analog input voltage into digital data, comprising:
    a first step in which the input voltage is compared with a plurality of threshold voltages, and judgment is made regarding which one from among a plurality of segments the input voltage belongs to;
    a second step in which a first voltage and a second voltage are generated such that the segment to which the input voltage belongs is sandwiched between the first voltage and the second voltage;
    a third step in which a third voltage is generated by amplifying the difference between the first voltage and the input voltage with a predetermined common voltage as a base;
    a fourth step in which a fourth voltage is generated by amplifying the difference between the second voltage and the input voltage with the common voltage as a base;
    a fifth step in which a region between the third voltage and the fourth voltage is divided into a plurality of segments, and judgment is made regarding which one from among the plurality of segments the common voltage belongs to;
    a sixth step in which a fifth voltage and a sixth voltage are generated such that the segment to which the common voltage belongs is sandwiched between the fifth voltage and the sixth voltage;
    a seventh step in which a seventh voltage is generated by amplifying the difference between the fifth voltage and the common voltage with the common voltage as a base; and
    an eighth step in which an eighth voltage is generated by amplifying the difference between the sixth voltage and the common voltage with the common voltage as a base,
    wherein the fifth step through the eighth step are repeatedly executed,
    and wherein, when the flow returns from the eighth step to the fifth step, the seventh voltage obtained in the seventh step in the previous loop is used as the third voltage in the fifth step in the subsequent loop, and the eighth voltage obtained in the eighth step in the previous loop is used as the fourth voltage in the fifth step in the subsequent loop.

2. An A/D converting method according to claim 1, wherein, in the sixth step, the fifth voltage and the sixth voltage are each generated by interpolation of a range between the third voltage and the fourth voltage.

3. An A/D converting method according to claim 1, wherein the first voltage through the eighth voltage are each generated as a differential signal.

4. An A/D converting method according to claim 3, wherein, in the sixth step, the fifth voltage and the sixth voltage are each generated by performing extrapolation from the third voltage and the fourth voltage.

5. A pipeline A/D converter configured to convert an analog input voltage into digital data, the pipeline A/D converter comprising an A-type converter circuit, at least one B-type converter circuit, and a comparator array, connected in series,
    wherein the A-type converter circuit comprises:
        a first sub-A/D converter configured to compare the input voltage with a plurality of threshold voltages, and to judge which one from among a plurality of segments the input voltage belongs to;
        a first amplifier circuit configured to generate a first voltage having a voltage level that is equal to or greater than the upper limit of the segment to which the input voltage belongs, to generate a third voltage by amplifying the difference between the first voltage and the input voltage with a predetermined common voltage as a base, and to output the third voltage to the B-type converter circuit arranged as a downstream stage; and
        a second amplifier circuit configured to generate a second voltage having a voltage level that is equal to or smaller than the lower limit of the segment to which the input voltage belongs, to generate a fourth voltage by amplifying the difference between the second voltage and the input voltage with the common voltage as a base, and to output the fourth voltage to the B-type converter circuit arranged as a downstream stage,
    and wherein the B-type converter circuit comprises:
        a second-sub A/D converter configured to divide a range between the third voltage and the fourth voltage received from the upstream stage into a plurality of segments, and to judge which one from among the plurality of segments the common voltage belongs to;
        a third amplifier circuit configured to generate a seventh voltage by amplifying the difference between the common voltage and a fifth voltage having a voltage level that is equal to or greater than the upper limit of the segment to which the common voltage belongs, and to output the seventh voltage as the third voltage to the B-type converter circuit arranged as the downstream stage; and
        a fourth amplifier circuit configured to generate an eighth voltage by amplifying the difference between the common voltage and a sixth voltage having a voltage level that is equal to or smaller than the lower limit of the segment to which the common voltage belongs, and to output the eighth voltage as the fourth voltage to the B-type converter circuit arranged as the downstream stage,
    and wherein the comparator array is configured to divide a range between the third voltage and the fourth voltage received from the B-type converter circuit arranged as the immediately upstream stage into a plurality of segments, and to judge which one from among a plurality of segments the common voltage belongs to.

6. An A/D converter according to claim 5, wherein the first amplifier circuit comprises:
a first capacitor array comprising a plurality of first capacitors arranged such that their first terminals are connected together;
a first switch circuit configured to apply the input voltage to second terminals of the first capacitor array in a sampling state, and to apply, in an interpolation amplification state, a reference voltage to the second terminals of certain first capacitors from among the first capacitor array, the number of which is determined according to the judgment result obtained by the first sub-A/D converter;
a first switch arranged between the first terminal of the first capacitor array and a fixed voltage terminal, and configured to be turned on in the sampling state, and to be turned off in the interpolation amplification state; and
a first amplifier arranged such that the common voltage is input to its first input terminal, and its second input terminal is connected to the first terminal of the first capacitor array,
and wherein the second amplifier circuit comprises a second capacitor array, a second switch circuit, a second switch, and a second amplifier, and is configured in the same manner as that of the first amplifier circuit.

7. An A/D converter according to claim 5, wherein the third amplifier circuit and the fourth amplifier circuit are respectively configured to generate the fifth voltage and the sixth voltage by interpolating from the third voltage and the fourth voltage.

8. An A/D converter according to claim 7, wherein the third amplifier circuit comprises:
a third capacitor array comprising a plurality of third capacitors arranged such that their first terminals are connected together;
a fourth capacitor array arranged such that their first terminals are connected together to the first terminals of the third capacitor array;
a third switch circuit configured to apply the third voltage to the second terminals of the third capacitor array in a sampling state, and to apply, in an interpolation amplification state, a fixed voltage to the second terminals of certain third capacitors from among the third capacitor array, the number of which is determined according to the judgment result obtained by the second sub-A/D converter;
a fourth switch circuit configured to apply the fourth voltage to the second terminals of the fourth capacitor array in the sampling state, and to apply, in the interpolation amplification state, a fixed voltage to the second terminals of the certain fourth capacitors from among the fourth capacitor array, the number of which is determined according to the judgment result obtained by the second sub-A/D converter;
a third switch arranged between the fixed voltage terminal and the connected-together first terminals of the third capacitor array and the fourth capacitor array, and configured to be turned on in the sampling state, and to be turned off in the interpolation amplification state; and
a third amplifier arranged such that the common voltage is input to its first input terminal, and its second input terminal is connected to the first terminals of the third capacitor array and the fourth capacitor array to which they are connected together,
and wherein the fourth amplifier circuit comprises a fifth capacitor array, a sixth capacitor array, a fifth switch circuit, a sixth switch circuit, a fourth switch, and a fourth amplifier, and is configured in the same manner as that of the aforementioned third amplifier circuit.

9. An A/D converter according to claim 8, wherein the third switch circuit is configured to apply the third voltage received from its upstream stage as the fixed voltage when the fixed voltage is to be applied to the third capacitor array in the interpolation amplification state, and the fourth switch circuit is configured to apply the fourth voltage received from its upstream stage as the fixed voltage when the fixed voltage is to be applied to the fourth capacitor array in the interpolation amplification state, thereby canceling the offset voltage of the amplifier of the converter circuit of the upstream stage.

10. An A/D converter according to claim 8, wherein the first amplifier circuit through the fourth amplifier circuit are each configured as a differential amplifier.

11. An A/D converter according to claim 10, wherein the third amplifier circuit and the fourth amplifier circuit are respectively configured to generate the fifth voltage and the sixth voltage by means of interpolation from, or otherwise extrapolation from, the third voltage and the fourth voltage using a combination of the non-inverted signal of, or otherwise the inverted signal of, the third voltage and the non-inverted signal of, or otherwise the inverted signal of, the fourth voltage.

12. An A/D converter according to claim 11, wherein the third switch circuit is configured to apply the non-inverted signal of, or otherwise the inverted signal of, the third voltage to the second terminal of the third capacitor array in the sampling state,
and wherein the fourth switch circuit is configured to apply the non-inverted signal of, or otherwise the inverted signal of, the fourth voltage to the second terminal of the fourth capacitor array in the sampling state.

13. An A/D converter according to claim 8, wherein the B-type converter circuit further comprises a gain adjustment unit which is capable of digitally controlling the gains of the third amplifier and the fourth amplifier.

14. An A/D converter according to claim 5, further comprising:
an input switch arranged upstream of the B-type converter circuit, and configured to supply the third voltage and the fourth voltage to the B-type converter circuit while performing swapping between them; and
an output switch arranged downstream of the B-type converter circuit, and configured to output the seventh voltage and the eighth voltage to its downstream B-type converter circuit while performing swapping between them.

15. An A/D converter according to claim 6, wherein the first amplifier and the second amplifier each comprise a dynamic differential amplifier,
and wherein the dynamic differential amplifier comprises:
a first input terminal and a second input terminal;
a first output terminal and a second output terminal;
a first load capacitor arranged between the first output terminal and a fixed voltage terminal;
a second load capacitor arranged between the second output terminal and the fixed voltage terminal;
an initializing circuit configured to initialize the charge stored in each of the first load capacitor and the second load capacitor;

an input differential pair comprising a first input transistor and a second input transistor arranged such that the first load capacitor and the second load capacitor respectively function as their load, and their control terminals are respectively connected to the first input terminal and the second input terminal; and
a control circuit configured to disconnect a charging/discharging path for the first load capacitor and the second load capacitor when the midpoint voltage between the electric potentials at the first output terminal and the second output terminal reaches a predetermined threshold voltage.

16. An A/D converter according to claim 8, wherein the third amplifier and the fourth amplifier each comprise a dynamic differential amplifier,
and wherein the dynamic differential amplifier comprises:
a first input terminal and a second input terminal;
a first output terminal and a second output terminal;
a first load capacitor arranged between the first output terminal and a fixed voltage terminal;
a second load capacitor arranged between the second output terminal and the fixed voltage terminal;
an initializing circuit configured to initialize the charge stored in each of the first load capacitor and the second load capacitor;
an input differential pair comprising a first input transistor and a second input transistor arranged such that the first load capacitor and the second load capacitor respectively function as their load, and their control terminals are respectively connected to the first input terminal and the second input terminal; and
a control circuit configured to disconnect a charging/discharging path for the first load capacitor and the second load capacitor when the midpoint voltage between the electric potentials at the first output terminal and the second output terminal reaches a predetermined threshold voltage.

17. An A/D converter according to claim 15, further comprising:
a first switch arranged between the first load capacitor and the first input transistor; and
a second switch arranged between the second load capacitor and the second input transistor,
wherein the control circuit is configured to disconnect the charging/discharging paths for the first load capacitor and the second load capacitor by turning off the first switch and the second switch.

18. An A/D converter according to claim 15, wherein the dynamic differential amplifier further comprises a tail current source configured to supply a tail current to the input differential pair,
wherein the control circuit is configured to disconnect the charging/discharging path for the first load capacitor and the second load capacitor by turning off the tail current source.

19. An A/D converter according to claim 15, wherein the control circuit comprises:
a first dividing capacitor and a second dividing capacitor arranged in series between the first output terminal and the second output terminal; and
a comparator configured to compare an electric potential at a connection node that connects the first dividing capacitor and the second dividing capacitor with a predetermined threshold voltage.

20. An A/D converter according to claim 19, wherein the comparator comprises an inverter configured to receive a power supply voltage and a ground voltage as a power supply.

21. An A/D converter according to claim 19, wherein the initializing circuit is configured to initialize the electric potential at the connection node that connects the first dividing capacitor and the second dividing capacitor to the same electric potentials as those at the first output terminal and the second output terminal.

22. An A/D converter according to claim 21, wherein the control circuit comprises a NAND gate configured to receive the respective electric potentials at the first load capacitor and the second load capacitor, and configured to disconnect the charging/discharging path for the first load capacitor and the second load capacitor according to the output of the NAND gate,
and wherein the NAND gate comprises a first P-channel transistor, a first N-channel transistor, a second N-channel transistor sequentially stacked between the power supply terminal and the ground terminal so as to form a first path, and a second P-channel transistor, a third N-channel transistor, and a fourth N-channel transistor sequentially stacked between the power supply terminal and the ground terminal so as to form a second path arranged in parallel with the first path,
and wherein a first input signal is applied to the gates of the first P-channel transistor, the first N-channel transistor, and the fourth N-channel transistor,
and wherein a second input signal is applied to the gates of the second P-channel transistor, the second N-channel transistor, and the third N-channel transistor,
and wherein the output terminal of the NAND gate is connected to the drains of the first P-channel transistor and the second P-channel transistor.

23. A dynamic differential amplifier comprising:
a first input terminal and a second input terminal;
a first output terminal and a second output terminal;
a first load capacitor arranged between the first output terminal and a fixed voltage terminal;
a second load capacitor arranged between the second output terminal and the fixed voltage terminal;
an initializing circuit configured to initialize the charge stored in each of the first load capacitor and the second load capacitor;
an input differential pair comprising a first input transistor and a second input transistor arranged such that the first load capacitor and the second load capacitor respectively function as their load, and their control terminals are respectively connected to the first input terminal and the second input terminal; and
a control circuit configured to disconnect a charging/discharging path for the first load capacitor and the second load capacitor when the midpoint voltage of the electric potentials at the first output terminal and the second output terminal reaches a predetermined threshold voltage.

24. A dynamic differential amplifier according to claim 23, further comprising:
a first switch arranged between the first load capacitor and the first input transistor; and
a second switch arranged between the second load capacitor and the second input transistor,
wherein the control circuit is configured to disconnect the charging/discharging path for the first load capacitor and the second load capacitor by turning off the first switch and the second switch.

* * * * *